(12) United States Patent
Huang et al.

(10) Patent No.: US 12,376,322 B2
(45) Date of Patent: Jul. 29, 2025

(54) SEMICONDUCTOR DEVICE HAVING THIN BOTTOM CHANNEL AND MANUFACTURING METHOD THEREOF

(71) Applicant: Taiwan Semiconductor Manufacturing Company, Ltd., Hsinchu (TW)

(72) Inventors: Wang-Chun Huang, Kaohsiung (TW); Hou-Yu Chen, Hsinchu County (TW); Jin Cai, Hsinchu (TW); Chih-Hao Wang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 470 days.

(21) Appl. No.: 17/826,174

(22) Filed: May 27, 2022

(65) Prior Publication Data
US 2023/0387261 A1    Nov. 30, 2023

(51) Int. Cl.
*H01L 21/28*    (2025.01)
*H10D 30/01*    (2025.01)
*H10D 64/23*    (2025.01)

(52) U.S. Cl.
CPC ......... *H10D 30/024* (2025.01); *H10D 64/251* (2025.01)

(58) Field of Classification Search
CPC ........... H01L 29/0673; H01L 29/42392; H01L 29/78696
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,963,258 B2 | 2/2015 | Yu et al. | |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,209,247 B2 | 12/2015 | Colinge et al. | |
| 9,214,555 B2 | 12/2015 | Oxland et al. | |
| 9,236,267 B2 | 1/2016 | De et al. | |
| 9,236,300 B2 | 1/2016 | Liaw | |
| 9,412,817 B2 | 8/2016 | Yang et al. | |
| 9,412,828 B2 | 8/2016 | Ching et al. | |
| 9,472,618 B2 | 10/2016 | Oxland | |

(Continued)

*Primary Examiner* — Eric A. Ward
(74) *Attorney, Agent, or Firm* — JCIPRNET

(57) ABSTRACT

A semiconductor device includes semiconductor nanosheets, a gate structure, and a dielectric spacer. The semiconductor nanosheets are vertically stacked over each other, disposed above a semiconductor substrate, and serve as channel regions. A bottommost semiconductor nanosheet most proximate from the semiconductor substrate is a thinnest nanosheet of the semiconductor nanosheets. The gate structure surrounds each of the semiconductor nanosheets in a first cross-section, and the dielectric spacer is interposed between the bottommost semiconductor nanosheet and the semiconductor substrate and adjoins the gate structure in the first cross-section.

20 Claims, 26 Drawing Sheets

(56) References Cited

U.S. PATENT DOCUMENTS

| | | | |
|---|---|---|---|
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,548,303 B2 | 1/2017 | Lee et al. | |
| 9,576,814 B2 | 2/2017 | Wu et al. | |
| 9,608,116 B2 | 3/2017 | Ching et al. | |
| 2020/0083219 A1* | 3/2020 | Kang | H01L 29/0653 |
| 2020/0365687 A1* | 11/2020 | Xie | H01L 21/3065 |
| 2023/0317849 A1* | 10/2023 | Kim | H01L 29/7851 |

* cited by examiner

SEMICONDUCTOR DEVICE HAVING THIN BOTTOM CHANNEL AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. However, such scaling has also introduced increased complexity to the semiconductor manufacturing process. Thus, the realization of continued advances in ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
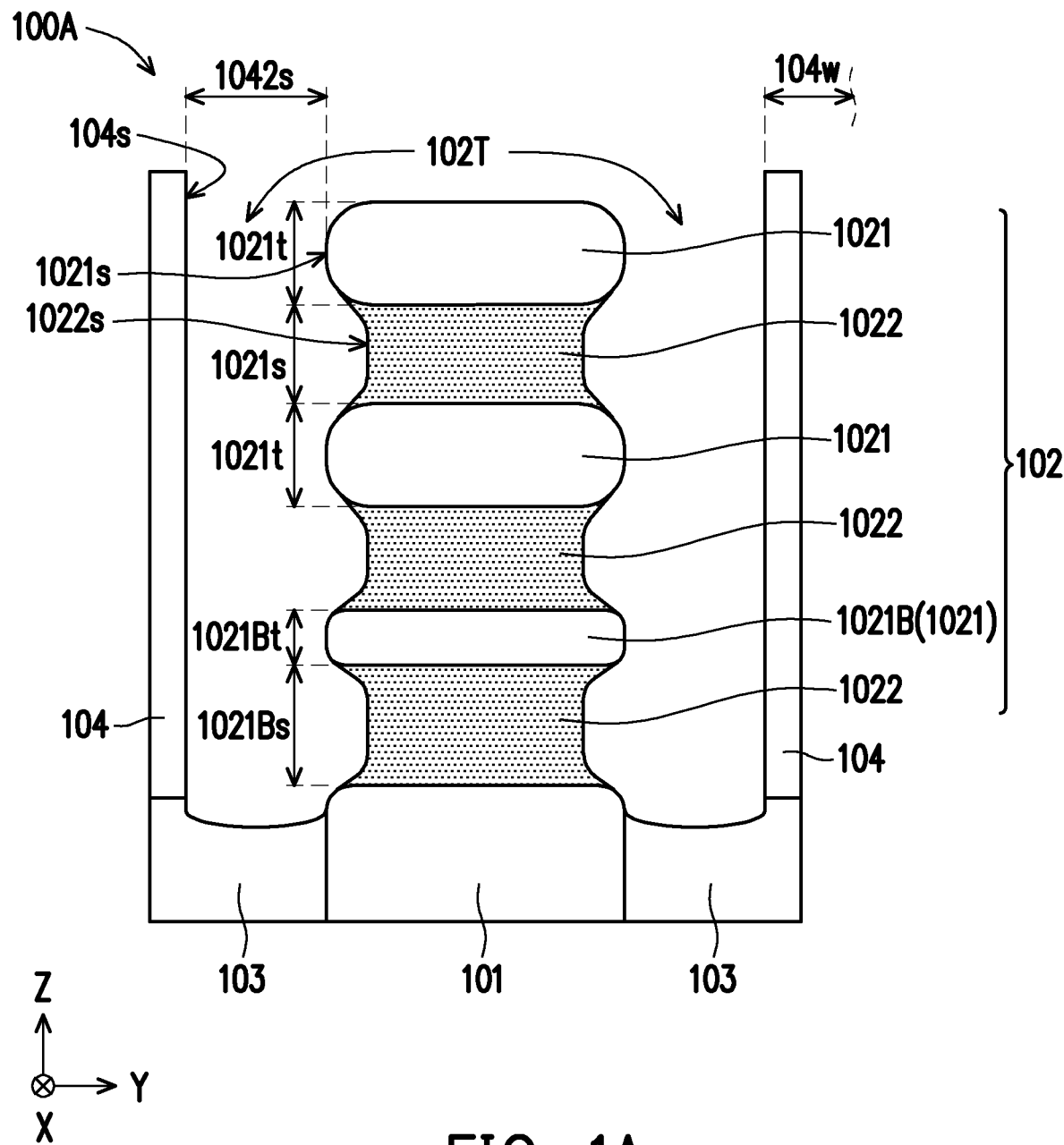
FIGS. 1A, 2A, 3A, 4A, 5A, 6A, 7A, and 8A are schematic cross-sectional views illustrating various stages of a manufacturing method of a semiconductor device along the Y-direction, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A, 2A, 3A, 4A, 5A, 6A, 7A, and 8A are schematic cross-sectional views illustrating various stages of a manufacturing method of a semiconductor device along the Y-direction, FIGS. 1B, 2B, 3B, 4B, 5B, 6B, 7B, and 8B are schematic cross-sectional views illustrating various stages of a manufacturing method of a semiconductor device along the X-direction and corresponding to FIGS. 1A, 2A, 3A, 4A, 5A, 6A, 7A, and 8A, respectively, in accordance with some embodiments.

Note that figures ending in "A" illustrate a cross-sectional view taken along the Y-direction which corresponds to a cross-section cut along the longitudinal direction of a gate structure, and figures ending in "B" illustrate a cross-sectional view taken along the X-direction which is substantially perpendicular to the Y-direction. For clarity of illustrations, in the drawings are illustrated the orthogonal axes (X, Y and Z) of the Cartesian coordinate system according to which the views are oriented. Specifically, these figures illustrate a manufacturing method of forming one or more nanostructure transistor device which may include a gate structure wrapping around the perimeter of one or more nanostructures (i.e. channel regions) for improved control of channel current flow. However, some embodiments contemplate aspects which may be used in planar devices, such as planar FETs, or in fin field-effect transistors (FinFETs) and/or any other suitable type and configuration of transistor device. It is understood that additional operations can be provided before, during, and after the operations shown by FIGS. 1A-8B, and some of the operations described below can be replaced or eliminated, for additional embodiments of the method. The order of the operations/processes may be interchangeable.

Referring to FIG. 1A, in the Y-Z cross-section 100A, a semiconductor fin structure 102 may be formed on a semiconductor substrate 101, and trenches 102T may be formed adjacent to opposing sides of the semiconductor fin structure 102. In some embodiments, the illustrated semiconductor substrate 101 is viewed as a lower fin portion of the semiconductor fin structure 102, and the lower fin portion is protruded from the semiconductor substrate (below the lower fin portion; not shown). It should be noted that while a single semiconductor fin structure 102 is illustrated, the disclosure is not limited by the numbers of fin structures 102, which may be adjusted according to the requirements of the circuit design. When multiple fin structures are formed, the trenches 102T may be disposed between any adjacent ones of the fin structures 102.

The semiconductor substrate 101 includes a crystalline silicon substrate or a bulk silicon substrate (e.g., wafer). In some embodiments, the semiconductor substrate 101 is made of a suitable elemental semiconductor (e.g., silicon, germanium), a suitable compound semiconductor (e.g., gallium arsenide, silicon carbide, indium arsenide, or indium phosphide), a suitable alloy semiconductor (e.g., silicon germanium carbide, gallium arsenic phosphide, or gallium indium phosphide), and/or the like. In some embodiments, the semiconductor substrate 101 includes a silicon-on-insulator (SOI) substrate. The semiconductor substrate 101 may include various doped regions (not individually shown) doped with p-type or n-type dopants, where the doped regions may be configured for an n-type FET, or alternatively, configured for a p-type FET.

The semiconductor fin structure 102 includes semiconductor channel layers 1021 and sacrificial semiconductor layers 1022 alternately stacked upon one another (e.g., along the Z direction). For example, the semiconductor fin structure 102 is formed by patterning a stack of semiconductor channel layers 1021 and the sacrificial semiconductor layers 1022 to form the trenches 102T using, e.g., lithography and etching techniques or other suitable processes. In some embodiments, the bottommost one of the sacrificial semiconductor layers 1022 (i.e., the layer most proximate from the semiconductor substrate 101) is formed on the semiconductor substrate 101, with the remaining semiconductor channel layers 1021 and the remaining sacrificial semiconductor layers 1022 alternately stacked on top. Either the semiconductor channel layer 1021 or the sacrificial semiconductor layer 1022 may be the topmost layer (i.e., the layer most distanced to the semiconductor substrate 101). The disclosure is not limited by the number of stacked semiconductor channel layers and sacrificial semiconductor layers.

The semiconductor channel layers 1021 and the sacrificial semiconductor layers 1022 may have different materials (or compositions) that provide for different oxidation rates and/or different etch selectivity between the layers. For example, when forming the trenches 102T, the sacrificial semiconductor layers 1022 are etched faster than the semiconductor channel layers 1021, so that the sidewalls 1022s of the sacrificial semiconductor layers 1022 are recessed from the sidewalls 1021s of the semiconductor channel layers 1021. In some embodiments, the semiconductor channel layers 1021 are formed of the same material as the semiconductor substrate 101, while the sacrificial semiconductor layers 1022 may be formed of a different material which may be selectively removed with respect to the material of the semiconductor substrate 101 and the semiconductor channel layers 1021. In some embodiments, the material of the semiconductor channel layers 1021 may be or include silicon (Si), where each of the semiconductor channel layers 1021 may be undoped or substantially dopant-free, while the material of the sacrificial semiconductor layers 1022 may be or include silicon germanium (SiGe). However, the disclosure is not limited thereto, and other suitable semiconductor material(s), or other combinations of materials for which selective etching is possible are contemplated within the scope of the disclosure.

The bottommost one of the semiconductor channel layers 1021, also called the bottommost semiconductor channel layer 1021B herein, is the layer most proximate from the semiconductor substrate 101. In some embodiments, the bottommost semiconductor channel layer 1021B has a thickness 1021Bt less than a thickness of other semiconductor channel layers 1021 above the bottommost semiconductor channel layer 1021B. For example, the semiconductor channel layers 1021 over the bottommost semiconductor channel layer 1021B may each have a thickness 1021t ranging from about 4 nm to about 15 nm, while the thickness 1021Bt of the bottommost semiconductor channel layer 1021B is less than about 4 nm. In some embodiments, the thickness 1021Bt of the bottommost semiconductor channel layer 1021B is less than a vertical spacing 1021s between two adjacent semiconductor channel layers 1021 over the bottommost semiconductor channel layer 1021B. For example, the vertical spacing 1021s is in a range of about 7 nm to about 20 nm. In some embodiments, the vertical spacing 1021Bs between the bottommost semiconductor channel layer 1021B and the underlying semiconductor substrate 101 is less than the vertical spacing 1021s. The vertical spacing 1021Bs may be in a range of about 1 nm to about 20 nm.

In some embodiments, isolation structures 103 (also called shallow trench isolation (STI) regions) may be formed on the semiconductor substrate and at opposing sides of the lower fin portion of the semiconductor substrate 101 as illustrated in FIG. 1A, where the trenches 102T are formed over the isolation structures 103. The isolation structures 103 may be formed of an insulation material (e.g., an oxide, a Si-based oxide (e.g., SiOC, SiOCN, etc.), a nitride, the like, any other suitable material, or combinations thereof) which may electrically isolate neighboring fin structures from each other. In some embodiments, the dielectric fin structures 104 are formed on the isolation structures 103 for isolating n-type FET regions from p-type FET regions (not individually shown). The respective trench 102T may separate the semiconductor fin structure 102 from the dielectric fin structure 104.

The respective dielectric fin structure 104 may be a single layer or may include sublayers having different dielectric materials. The material of the dielectric fin structure 104 may be different from that of the underlying isolation structure 103. For example, the dielectric fin structure 104 may be or include a nitride, an oxide, a combination thereof, and/or the like. For example, the thickness 1021Bt of the bottommost semiconductor channel layer 1021B is less than a lateral dimension 104w of the dielectric fin structure 104 (e.g., the width) measured along the Y-axis. In some embodiments, the lateral dimension 104w (e.g., the width) of the dielectric fin structure 104 is in a range of about 4 nm to about 20 nm. In some embodiments, the thickness 1021Bt of the bottommost semiconductor channel layer 1021B is less than a lateral spacing 1042s measured along the Y-axis and between the sidewall 1021s of the semiconductor channel layer 1021 and the sidewall 104s of the adjacent dielectric fin structure 104. For example, the lateral spacing 1042s is in a range of about 8 nm to about 18 nm.

Figure 1B:
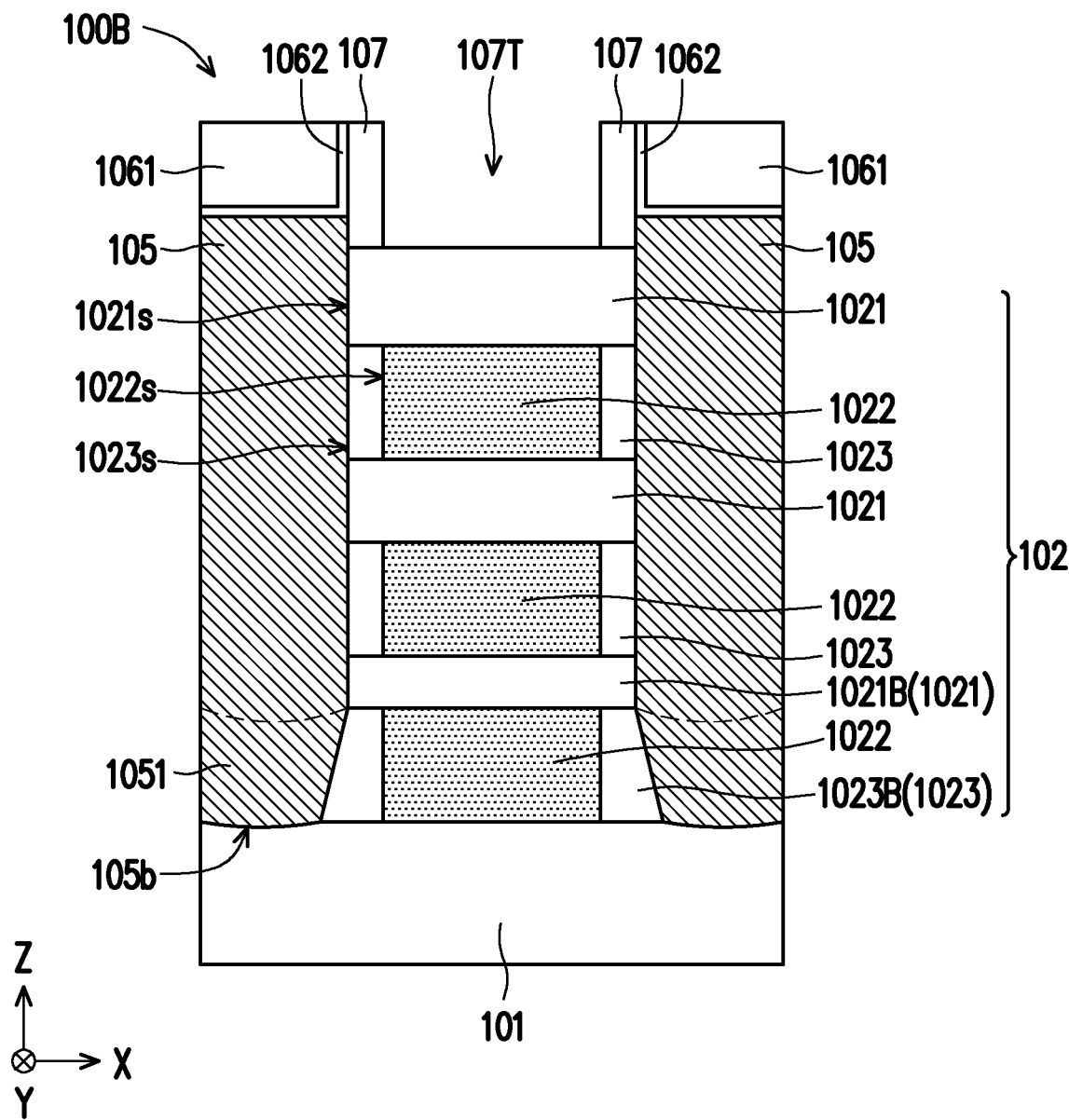
FIGS. 1B, 2B, 3B, 4B, 5B, 6B, 7B, and 8B are schematic cross-sectional views illustrating various stages of a manufacturing method of a semiconductor device along the X-direction and corresponding to FIGS. 1A, 2A, 3A, 4A, 5A, 6A, 7A, and 8A, respectively, in accordance with some embodiments.

Referring to FIG. 1B, in the X-Z cross-section 100B corresponding to the Y-Z cross-section 100A, the semiconductor fin structure 102 further includes inner spacers 1023 formed at opposing sidewalls 1022s of the respective sacrificial semiconductor layer 1022. For example, the outer sidewalls 1023s of the inner spacers 1023 are substantially aligned with the sidewalls 1021s of the semiconductor channel layers 1021. Alternatively, the outer sidewalls 1023s of the inner spacers 1023 are recessed from the sidewalls 1021s of the semiconductor channel layers 1021. In some embodiments, the bottommost ones of the inner spacers 1023, also called the bottommost inner spacers 1023B herein, laterally adjoin the semiconductor substrate 101. The inner spacers 1023 may separate the sacrificial semiconductor layer 1022 from source/drain (S/D) epitaxial structures 105. For example, the S/D epitaxial structures 105 are formed on the semiconductor substrate 101 and adjoin the sidewalls 1021s of the semiconductor channel layers 1021 and the outer sidewalls 1023s of the inner spacers 1023 (along the Y-direction). In some embodiments, the bottom 105b of each S/D epitaxial structure 105 is on the semiconductor substrate 101 which adjoins the bottom edge of the bottommost inner spacers 1023B.

The S/D epitaxial structures 105 may each include silicon germanium, indium arsenide, indium gallium arsenide, indium antimonide, germanium arsenide, germanium antimonide, indium aluminum phosphide, indium phosphide, any other suitable material, or combinations thereof. The S/D epitaxial structures 105 may be formed using an epitaxial layer growth process on the exposed surfaces of each of the semiconductor channel layers 1021 and the inner spacers 1023. The material of the S/D epitaxial structures 105 may be doped with a conductive dopant. For example, a strained material is epitaxially grown with an n-type dopant (or a p-type dopant) for straining the epitaxial structures in the n-type region (or the p-type region). In some embodiments, the bottom portions 1051 of the S/D epitaxial structures 105 adjoining the bottommost inner spacers 1023B may include un-doped regions and/or slightly doped regions). In some embodiments where the bottom portions 1051 of the S/D epitaxial structures 105 are un-doped regions, no visible interface between the bottom 105b of each S/D epitaxial structure 105 and the semiconductor substrate 101.

In some embodiments, a dielectric structure includes one or more interlayer dielectric (ILD) layer 1061 and one or more etch stop layer 1062 and may be formed over the S/D epitaxial structures 105. The ILD layer 1061 may be formed of a dielectric material such as silicon oxide, phosphosilicate glass (PSG), borosilicate glass (BSG), boron-doped phosphosilicate Glass (BPSG), undoped silicate glass (USG), or the like. The etch stop layer 1062 may include a suitable material such as silicon oxide, silicon nitride, silicon oxynitride, combinations thereof, or the like. In some embodiments, gate spacers 107 may be formed on the sidewalls of the dielectric structure (e.g., formed on the sidewalls of the etch stop layer 1062) and may be in contact with the top surface of the topmost one of the semiconductor channel layers 1021. The gate spacers 107 may be low-k spacers and may be formed of a suitable dielectric material, such as silicon oxide, silicon oxycarbonitride, or the like. In some embodiments, a gate trench 107T separates adjacent two of the gate spacers 107 and accessibly exposes a portion of the top surface of the topmost one of the semiconductor channel layers 1021.

Figure 2A:
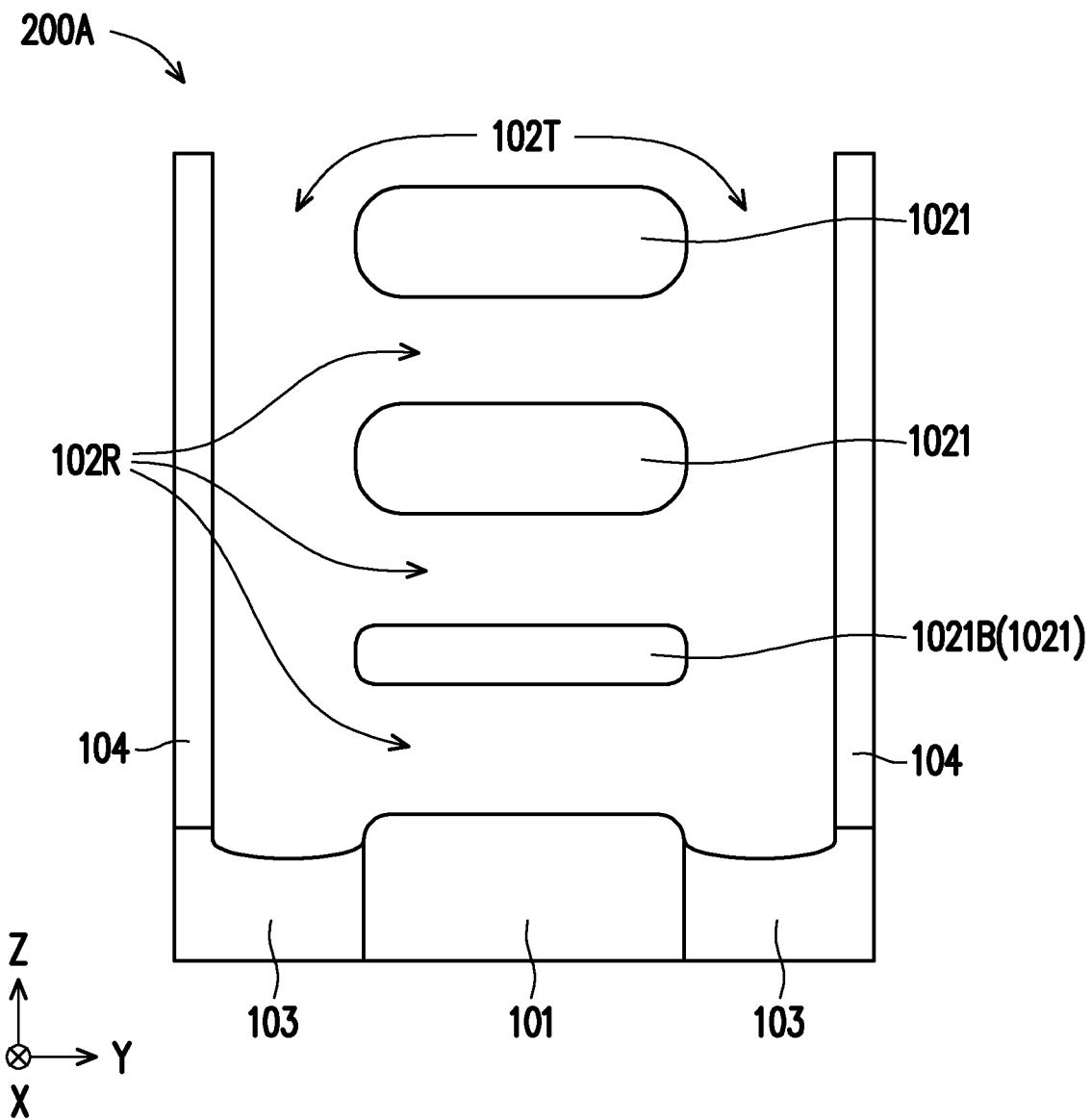
Figure 2B:
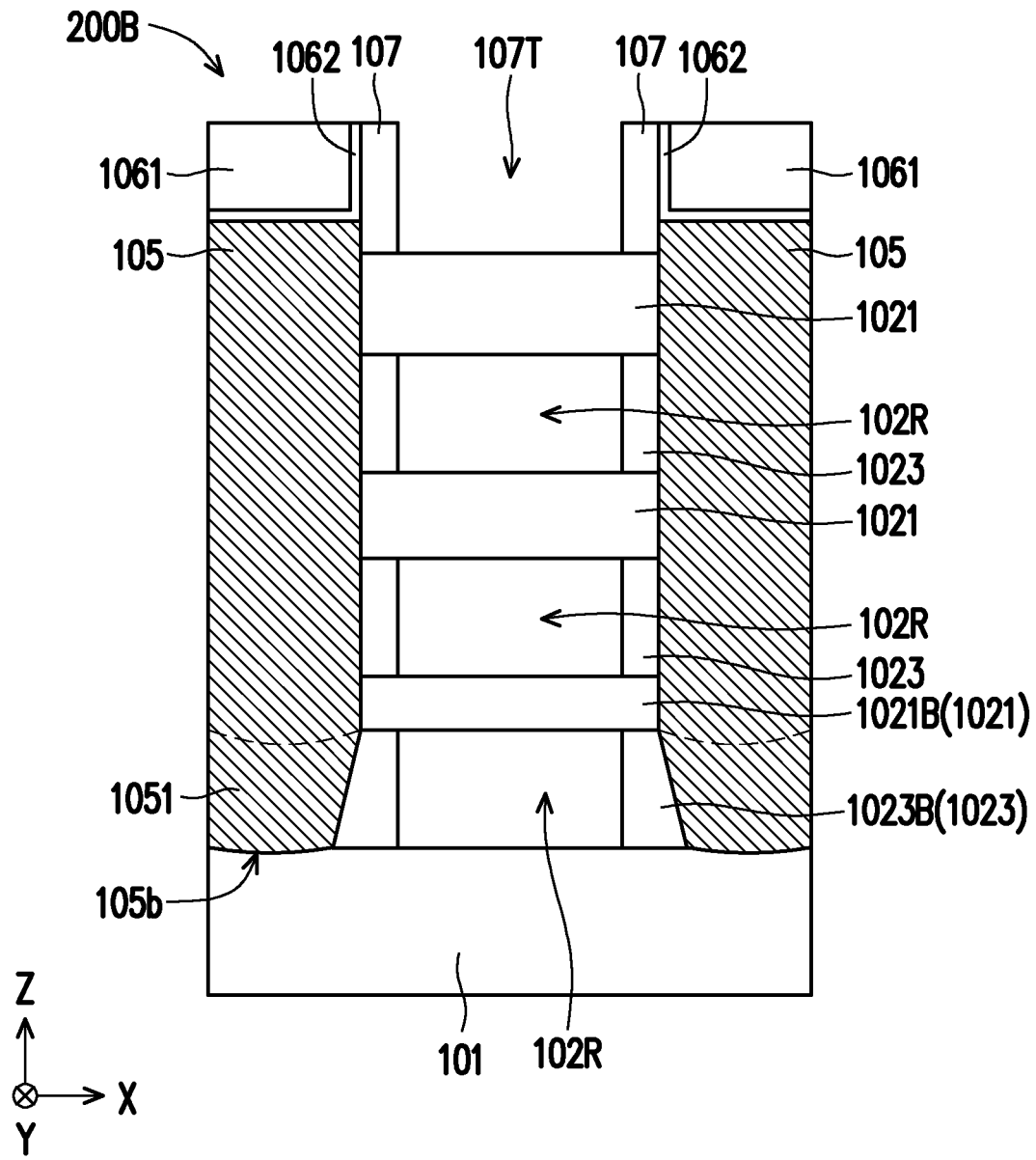

Referring to FIGS. 2A-2B and with reference to FIGS. 1A-1B, in the Y-Z cross-section 200A and the X-Z cross-section 200B, the sacrificial semiconductor layers 1022 may be removed to form recesses (or gaps) 102R. The recesses 102R may be in communication with the trenches 102T, where the recesses 102R may each extend along a horizontal direction (e.g., Y-direction and/or X-direction), and the trenches 102T may each extend along a vertical direction (e.g., Z-direction). For example, the sacrificial semiconductor layers 1022 are removed by performing an isotropic etching process, such as wet etching or the like, using etchants which are selective to the materials of the sacrificial semiconductor layers 1022, while the semiconductor channel layers 1021, the semiconductor substrate 101, the inner spacers 1023, the isolation structures 103, the dielectric fin structure 104, the ILD layer 1061, the etch stop layer 1062, and the gate spacers 107 may remain relatively un-etched as compared to the sacrificial semiconductor layers 1022. In embodiments in which the semiconductor channel layers 1021 include, e.g., Si or SiC, and the sacrificial semiconductor layers 1022 include, e.g., SiGe, tetramethylammonium hydroxide (TMAH), ammonium hydroxide, or the like, may be used to remove the sacrificial semiconductor layers 1022.

Figure 3A:
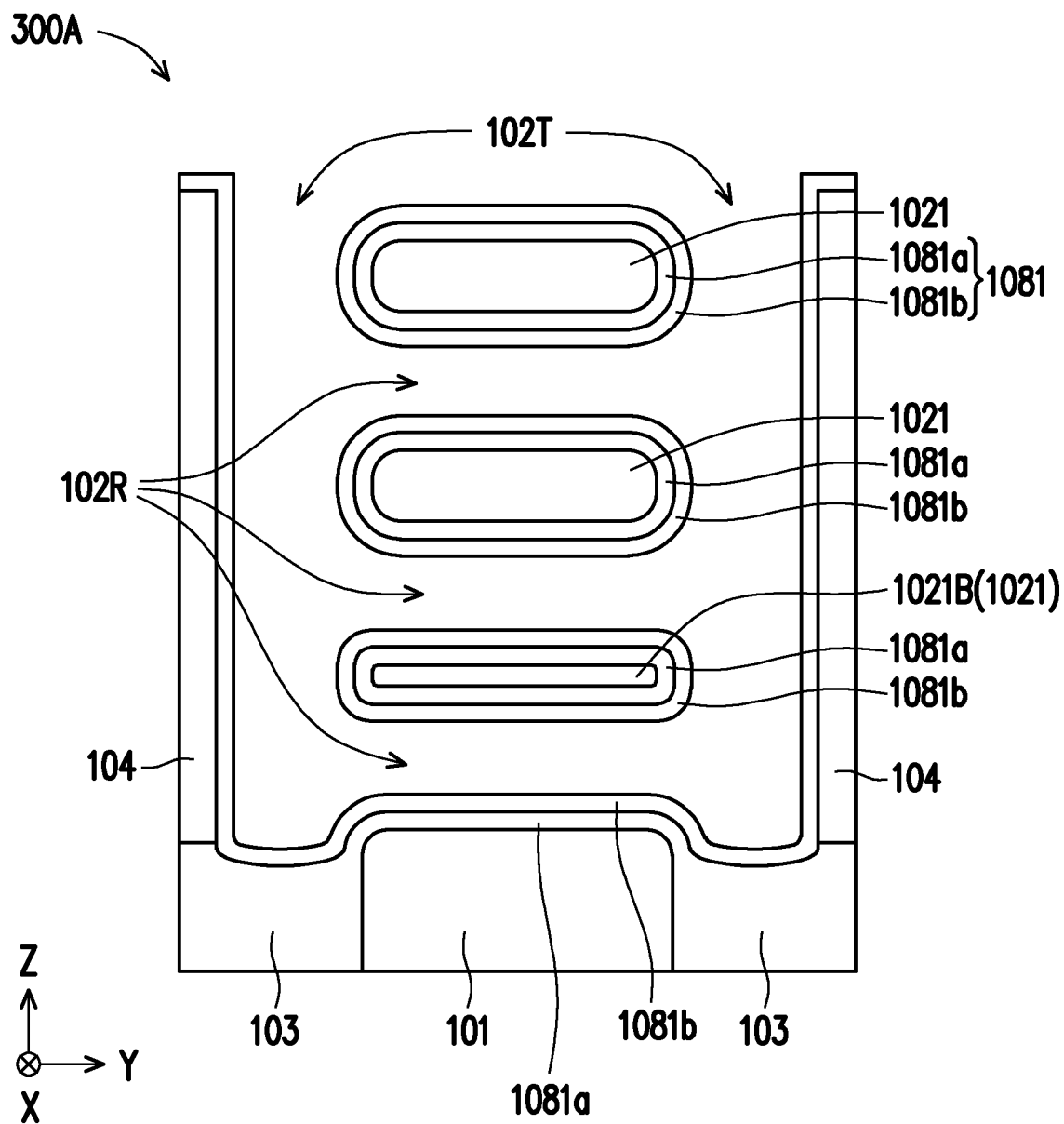
Figure 3B:
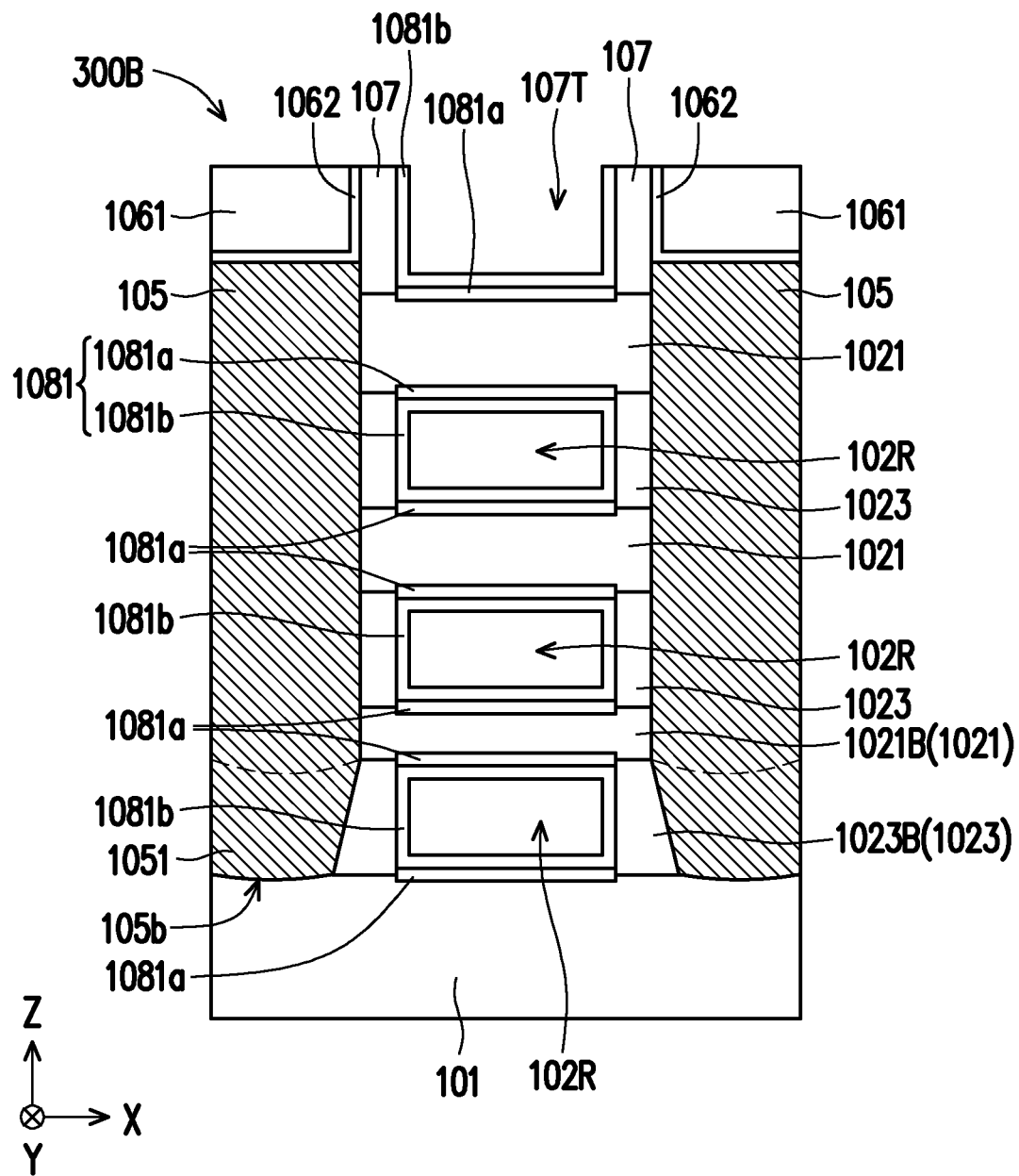

Referring to FIGS. 3A-3B, in the Y-Z cross-section 300A and the X-Z cross-section 300B, an interfacial layer 1081a and a high-k dielectric layer 1081b may be sequentially formed. The interfacial layer 1081a and the high-k dielectric layer 1081b may be collectively referred to as a gate dielectric layer 1081 of a gate structure. For example, in the Y-Z cross-section 300A, the interfacial layer 1081a is conformally formed on top surfaces, sidewalls, and bottom surfaces of the semiconductor channel layers 1021 to warp around the semiconductor channel layers 1021. The interfacial layer 1081a may also be formed on the exposed top surface of the semiconductor substrate 101. In the X-Z cross-section 300B, the interfacial layer 1081a is formed on the exposed surfaces of the semiconductor channel layers 1021 within the recesses 102R and also formed on the exposed surface of the semiconductor substrate 101. The interfacial layer 1081a may be an oxide-containing layer (e.g., a Si-based oxide layer), a nitride layer, an oxynitride layer, the like, any other suitable material, or combinations thereof. The interfacial layer 1081a may be formed by a chemical oxide technique, thermal oxide technique, atomic layer deposition (ALD), chemical vapor deposition (CVD), or other suitable technique. In some embodiments, the interfacial layer 1081a and the isolation structures 103 are formed of the same material, and thus no visible interface is formed therebetween as shown in FIG. 3A. Alternatively, the interfacial layer 1081a and the isolation structures 103 are formed of different materials, and thus a visible interface (not shown) can be observed.

In some embodiments, the high-k dielectric layer 1081b is conformally formed in the trenches 102T and the recesses 102R to overlay the interfacial layer 1081a. The interfacial layer 1081a may thus be interposed between the high-k dielectric layer 1081b and the semiconductor channel layers 1021. In the Y-Z cross-section 300A, the high-k dielectric layers 1081b may also be formed on top surfaces and sidewalls of the dielectric fin structures 104 and the exposed top surface of the isolation structures 103. In the X-Z cross-section 300B, the high-k dielectric layers 1081b may be formed in the gate trench 107T to cover the sidewalls of the gate spacers 107 and the top surface of the interfacial layer 1081a overlying the topmost one of the semiconductor channel layers 1021. For example, the high-k dielectric layers 1081b conformally formed in the recesses 102R may also cover the sidewalls of the inner spacers 1023 within the recesses 102R. In some embodiments, the high-k dielectric layers 1081b includes metal oxides, metal nitrides, metal silicates, transition metal-oxides, transition metal-nitrides, transition metal-silicates, or oxynitrides of metals, and may be formed by a suitable process, such as ALD, CVD, physical vapor deposition (PVD), plasma enhanced CVD (PECVD), metal organic CVD (MOCVD), sputtering, other suitable processes, or combinations thereof. Other suitable dielectric materials that can suppress tunneling current and prevent a high gate leakage current may be used.

Figure 4A:
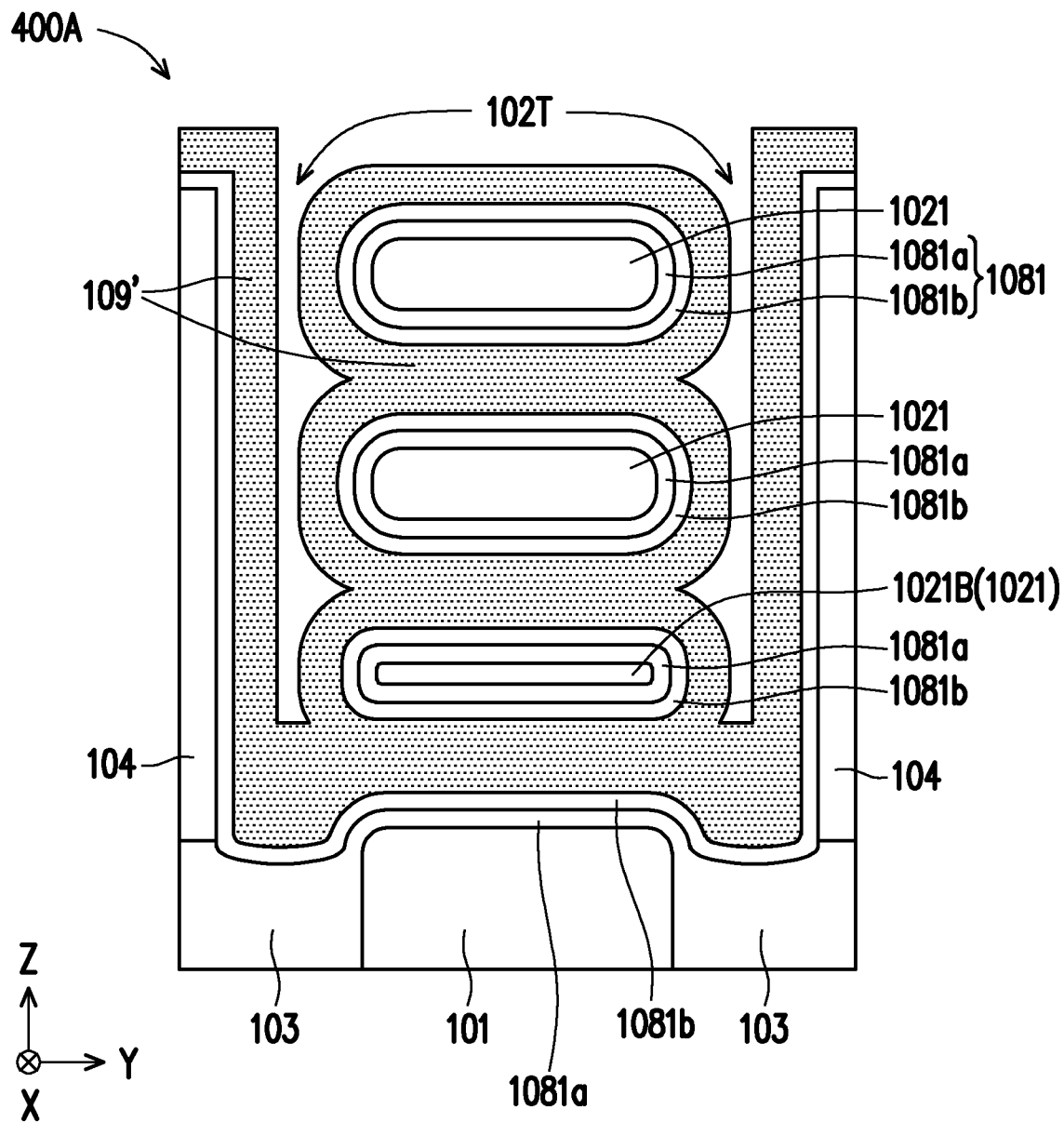
Figure 4B:
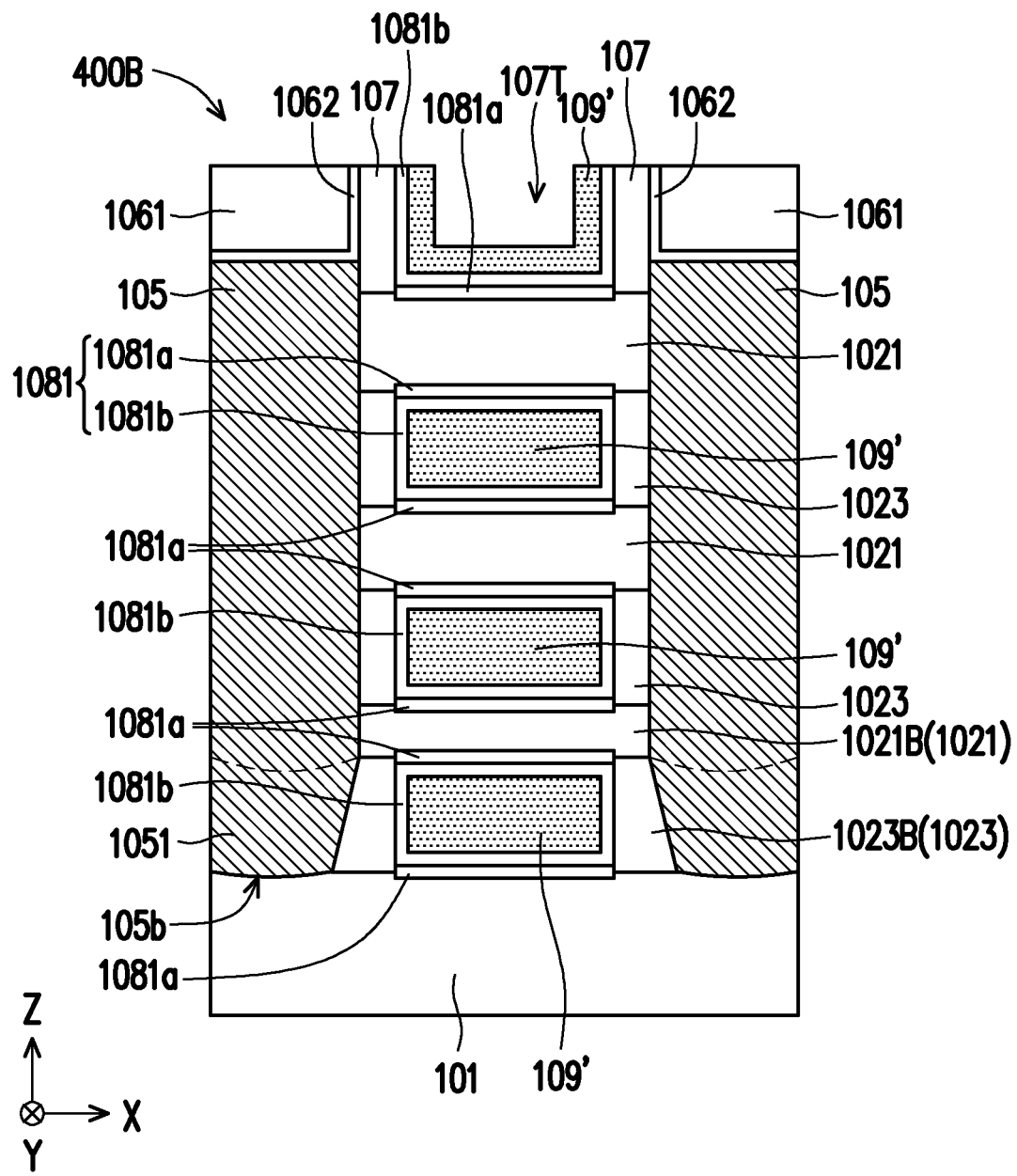

Referring to FIGS. 4A-4B and with reference to FIGS. 3A-3B, in the Y-Z cross-section 400A and the X-Z cross-section 400B, a dielectric spacer layer 109' may be formed on the high-k dielectric layers 1081b by a suitable process, such as ALD, CVD, PVD, a combination thereof, or other suitable processes. For example, in the Y-Z cross-section 400A, the dielectric spacer layer 109' is deposited on the outer surface of the high-k dielectric layers 1081b and formed in the trenches 102T and the recesses 102R. In the X-Z cross-section 400B, the dielectric spacer layer 109' may be formed in the gate trench 107T to conformally overlay the high-k dielectric layer 1081b. In some embodiments, the recesses 102R are completely filled by the dielectric spacer layer 109' as shown in FIGS. 4A-4B, while a portion of the trenches 102T are not filled by the dielectric spacer layer 109', depending on the deposited thickness of the dielectric spacer layer 109' and a spacing of the recesses 102R to be filled. Alternatively, the recesses 102R are partially filled by the dielectric spacer layer 109' as will be described later in FIGS. 9A-9B. Examples of the dielectric spacer material include, but are not limited to, aluminum oxide ($Al_2O_3$), hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, alloy, non-high-k dielectric material (e.g., $SiO_x$, SiN, etc.), or other applicable insulating materials.

Figure 5A:
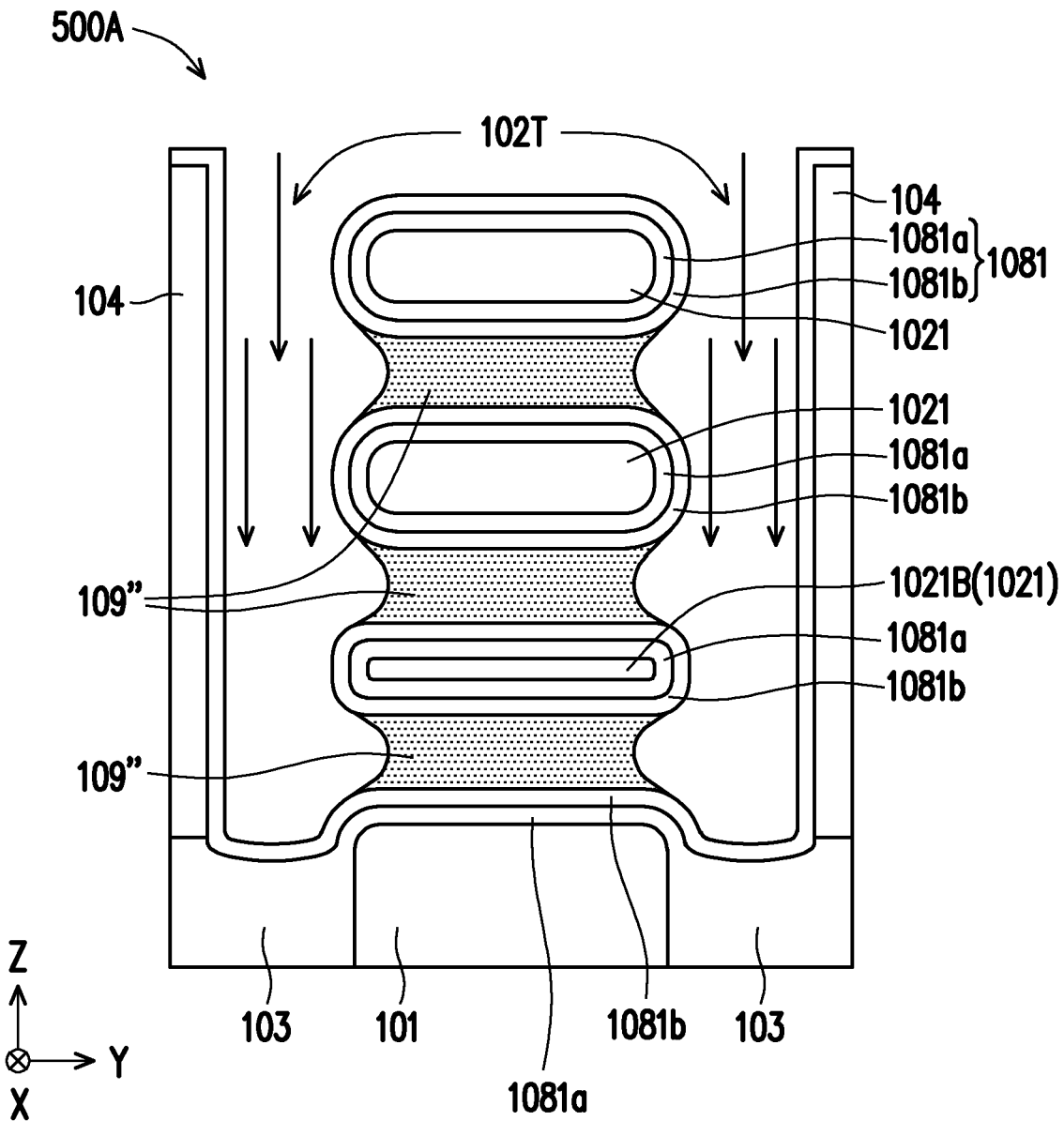
Figure 5B:
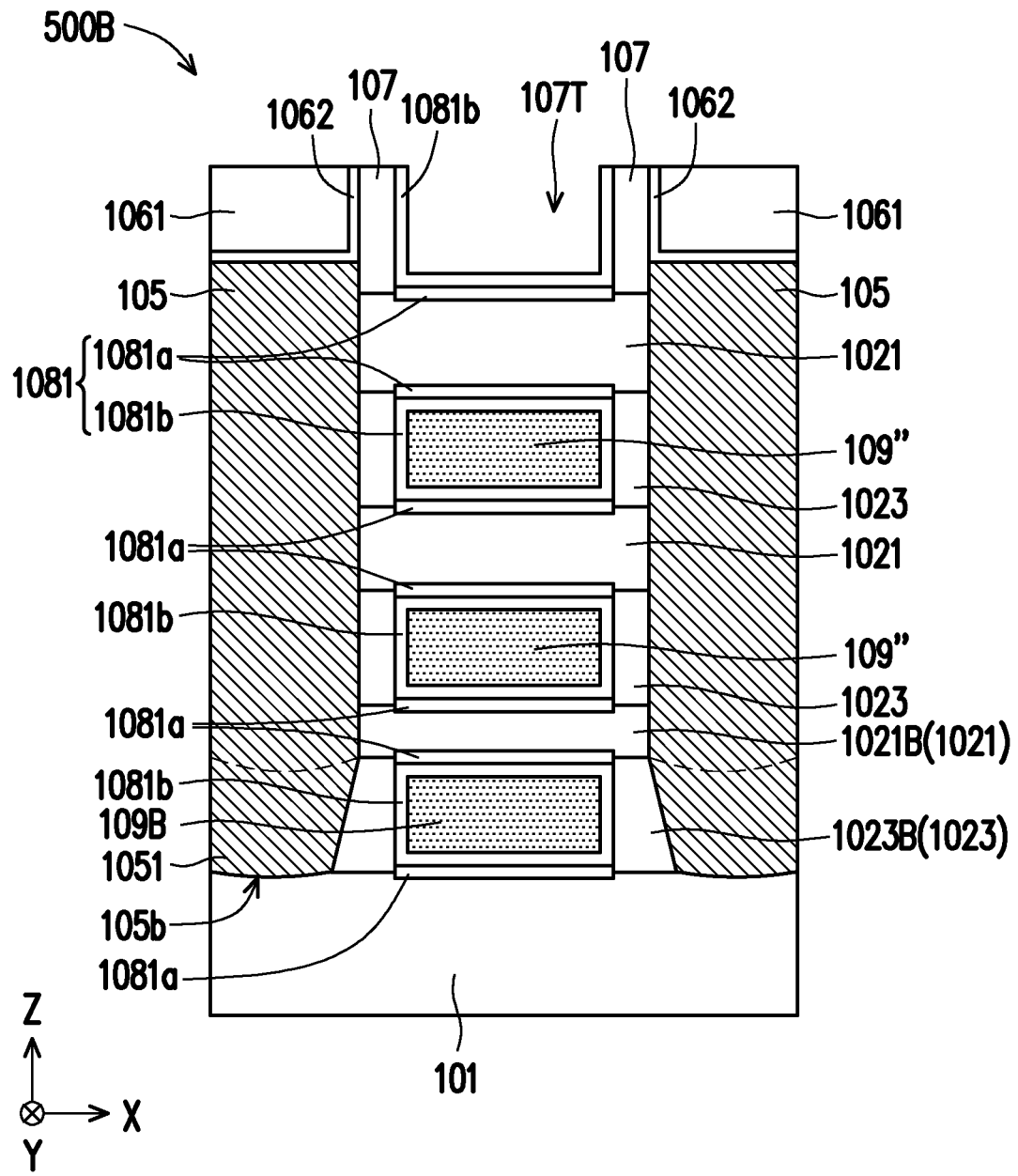

Referring to FIGS. 5A-5B and with reference to FIGS. 4A-4B, in the Y-Z cross-section 500A and the X-Z cross-section 500B, a portion of the dielectric spacer layer 109' may be removed to form dielectric spacers 109". For example, in the Y-Z cross-section 500A, a portion of the dielectric spacer layer 109' formed over the dielectric fin structures 104 and a portion of the dielectric spacer layer 109' formed over the isolation structures 103 and lining the high-k dielectric layer 1081b in the trenches 102T are removed. The remaining portions of the dielectric spacer layer 109' (i.e., the dielectric spacers 109") are left in the recesses 102R and interposed between two adjacent semiconductor channel layers 1021. In some embodiments, after the removal process, the dielectric spacers 109" in the Y-Z cross-section 500A may each have a concave sidewall profile, relative to the sidewalls of the semiconductor channel layers 1021. In the X-Z cross-section 500B, the dielectric spacer layer 109' formed in the gate trench 107T may be removed to accessibly expose the high-k dielectric layer 1081b in the gate trench 107T, while the remaining portions of the dielectric spacer layer 109' (i.e., the dielectric spacers 109") are left in the recesses 102R.

In some embodiments, a dry etch is performed to remove the portion of the dielectric spacer layer 109', where the surface reaction proceeds only in the vertical direction as indicated by the arrows in FIG. 5A. For example, the dry etch may include a plasma dry etching process or any acceptable anisotropic etch process, such as reactive ion etching (RIE), neutral beam etching (NBE), or the like. The anisotropic etch selectively removes the dielectric spacer layer 109' but does not substantially etch the semiconductor channel layers 1021. For example, the etch rate on the semiconductor channel layers 1021 is significantly lower than that of the dielectric spacer layer 109'. In some embodiments, the anisotropic etch selectively removes the dielectric spacer layer 109' but does not substantially etch the high-k dielectric layer 1081b and the interfacial layer 1081a. For example, the etch rates on the high-k dielectric layer 1081b and the interfacial layer 1081a are significantly lower than that of the dielectric spacer layer 109'. The etch parameter may be designed to be adequate such that at least the semiconductor channel layers 1021 are not adversely affected during the etching.

Figure 6A:
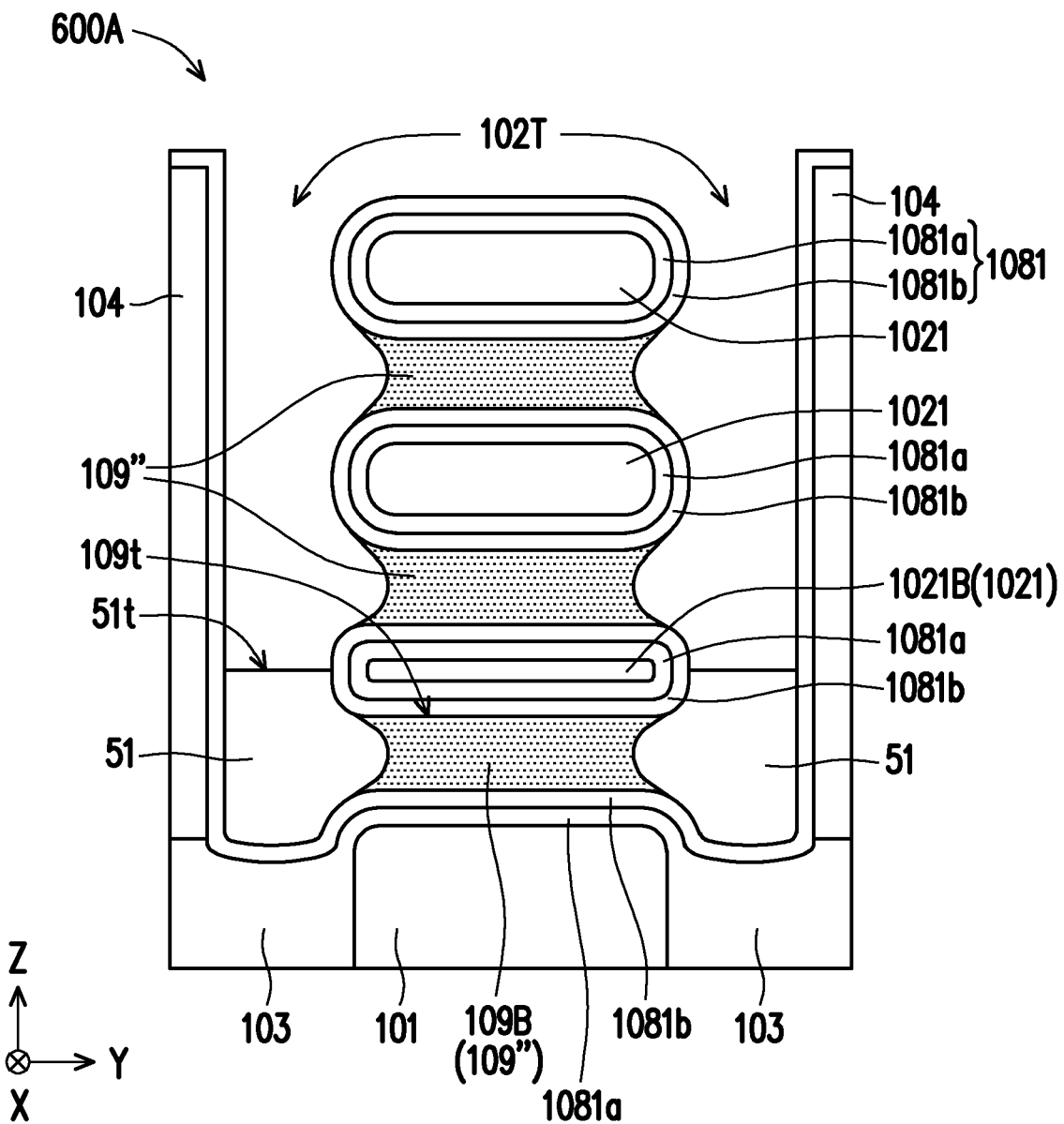
Figure 6B:
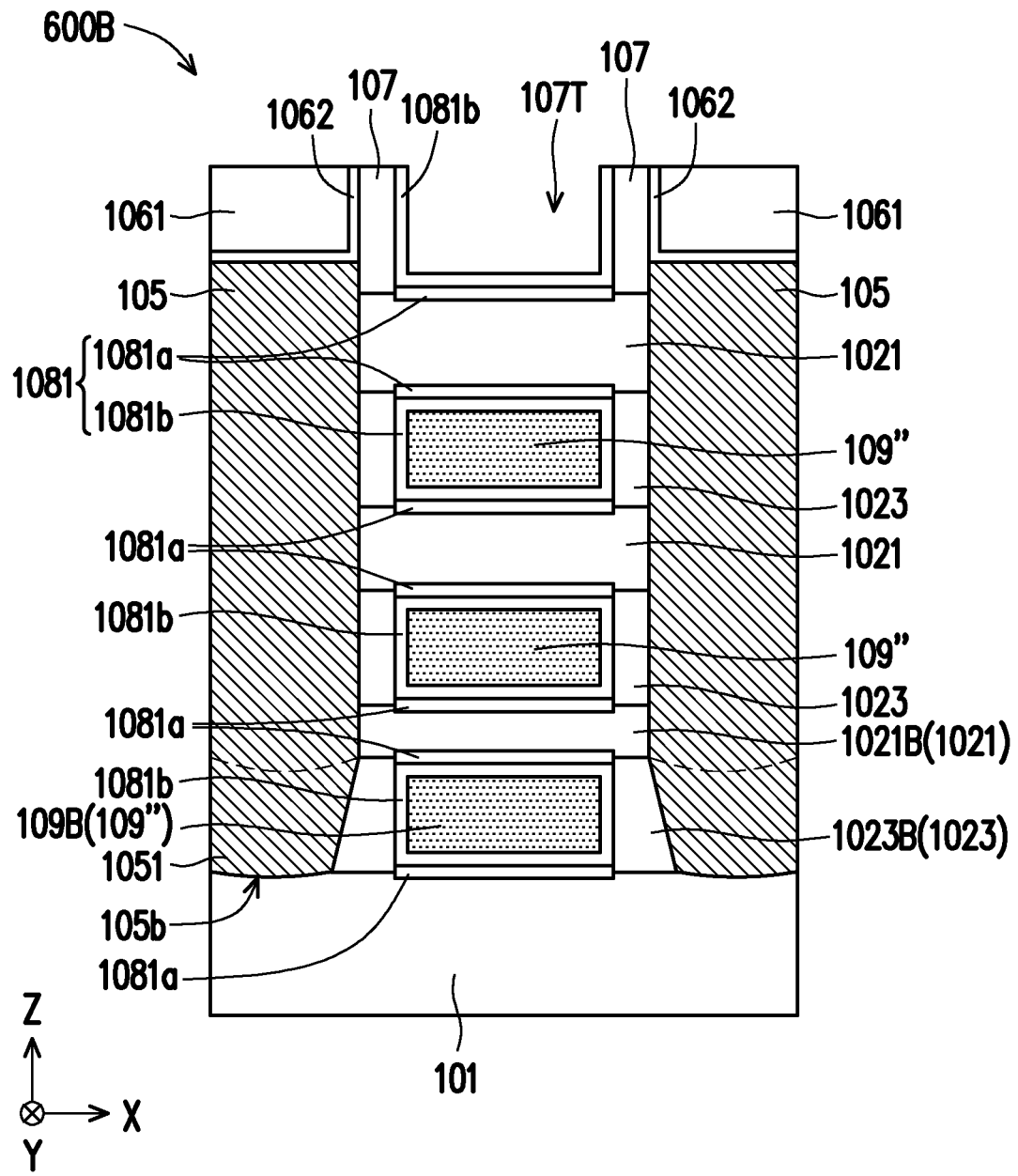

Referring to FIGS. 6A-6B, in the Y-Z cross-section 600A and the X-Z cross-section 600B, a bottom anti-reflective coating (BARC) layer 51 may be formed in the lower portion of the trenches 102T. For example, the BARC layer 51 is formed on the high-k dielectric layer 1081b over the isolation structures 103 to at least laterally cover the bottommost one of the dielectric spacers 109" (also called the bottom dielectric spacer 109B herein). For example, the top surface 51t of the BARC layer 51 is higher than the top surface 109t of the bottom dielectric spacer 109B. In some embodiments, the BARC layer 51 laterally covers not only the bottom dielectric spacer 109B but also a portion of the high-k dielectric layer 1081b which warps around the bottommost semiconductor channel layer 1021B. The BARC layer 51 may including organic materials serving as a masking layer (e.g., photoresist), and may be formed by spin coating or the like. Although other deposition processes (e.g., CVD, high density plasma, sputtering, etc.) and/or other suitable inorganic or hybrid materials (e.g., silicon nitride, silicon oxynitride, or combinations thereof) may alternatively be used. It should be understood that the formation of the BARC layer 51 cannot be observed in the X-Z cross-section 600B.

Figure 7A:
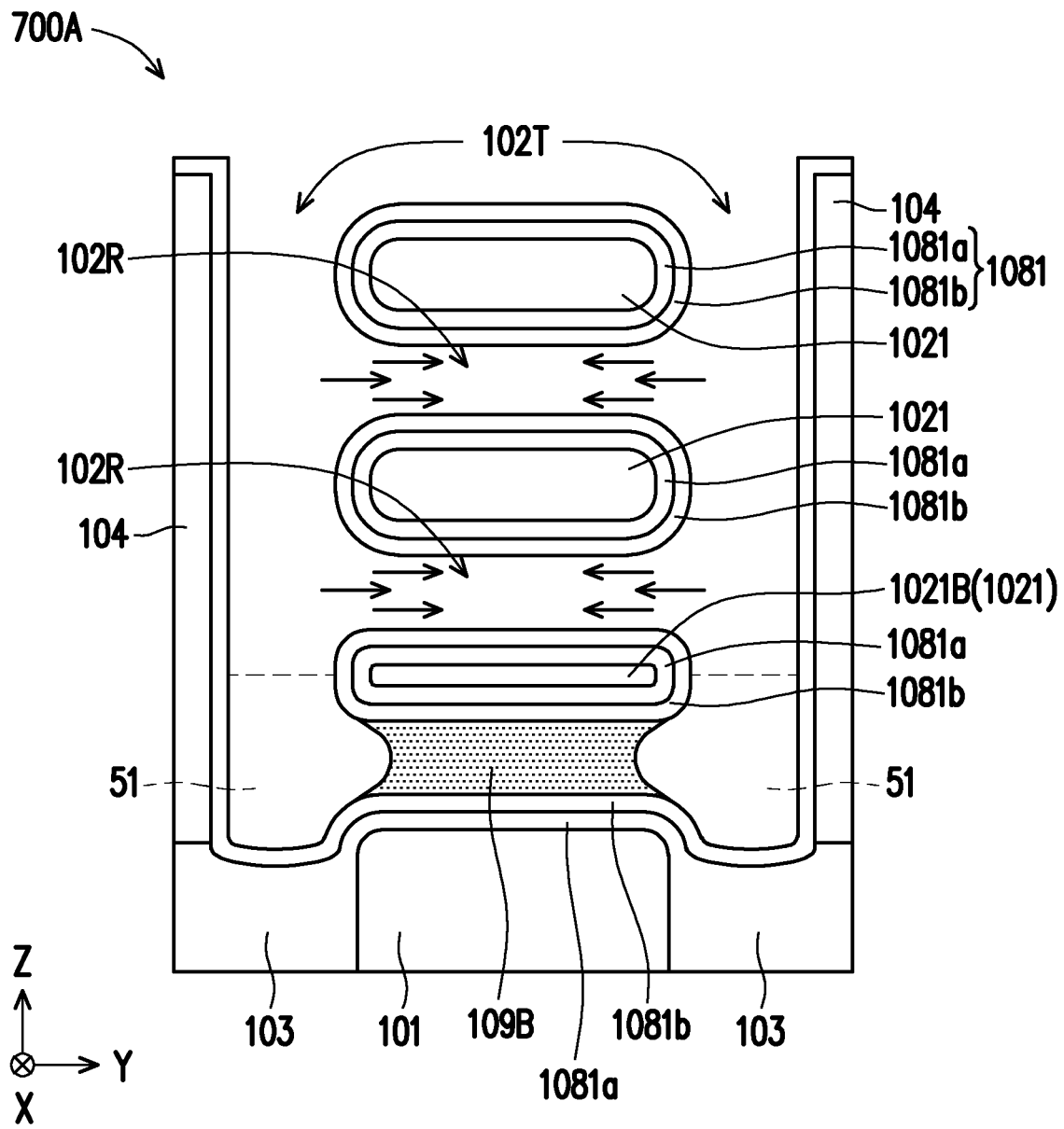
Figure 7B:
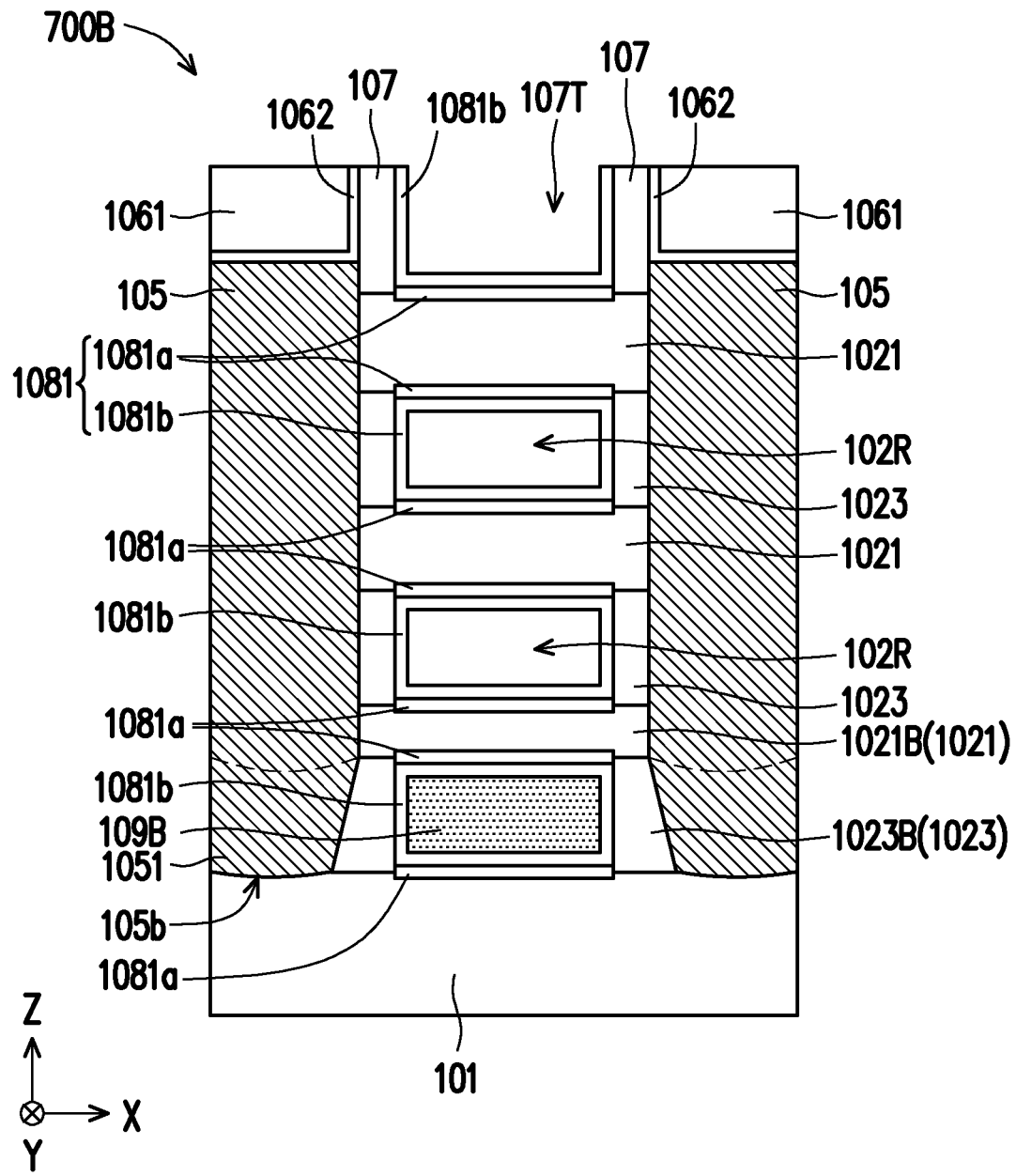

Referring to FIGS. 7A-7B and with reference to FIG. 6A-6B, in the Y-Z cross-section 700A and the X-Z cross-section 700B, some of the dielectric spacers 109" may be removed and only the bottom dielectric spacer 109B remains. In some embodiments, an etching process is performed to remove the dielectric spacers 109" above the bottom dielectric spacer 109B by using the BARC layer 51 as an etch mask. For example, a wet etch is performed to etch the dielectric spacers 109" in a horizontal direction as indicated by the arrows shown in FIG. 7A. The wet etch selectively removes the dielectric spacer layer 109" but does not substantially etch the semiconductor channel layers 1021 and the BARC layer 51. For example, the etch rates on the semiconductor channel layers 1021 and the BARC layer 51 are significantly lower than that of the dielectric spacers 109". In some embodiments, the wet etch selectively removes the dielectric spacer layer 109" but does not substantially etch the high-k dielectric layer 1081b and the interfacial layer 1081a. For example, the etch rates on the high-k dielectric layer 1081b and the interfacial layer 1081a are significantly lower than that of the dielectric spacers 109". The etch parameter may be designed to be adequate such that at least the semiconductor channel layers 1021 are not adversely affected during the etching. After the dielectric spacers 109" above the bottom dielectric spacer 109B are removed, the recesses 102R are once again formed. Subsequently, the BARC layer 51 may be removed to leave the bottom dielectric spacer 109B accessibly exposed by any acceptable process such as ashing, stripping, or the like, depending on the materials of the BARC layer 51.

Figure 8A:
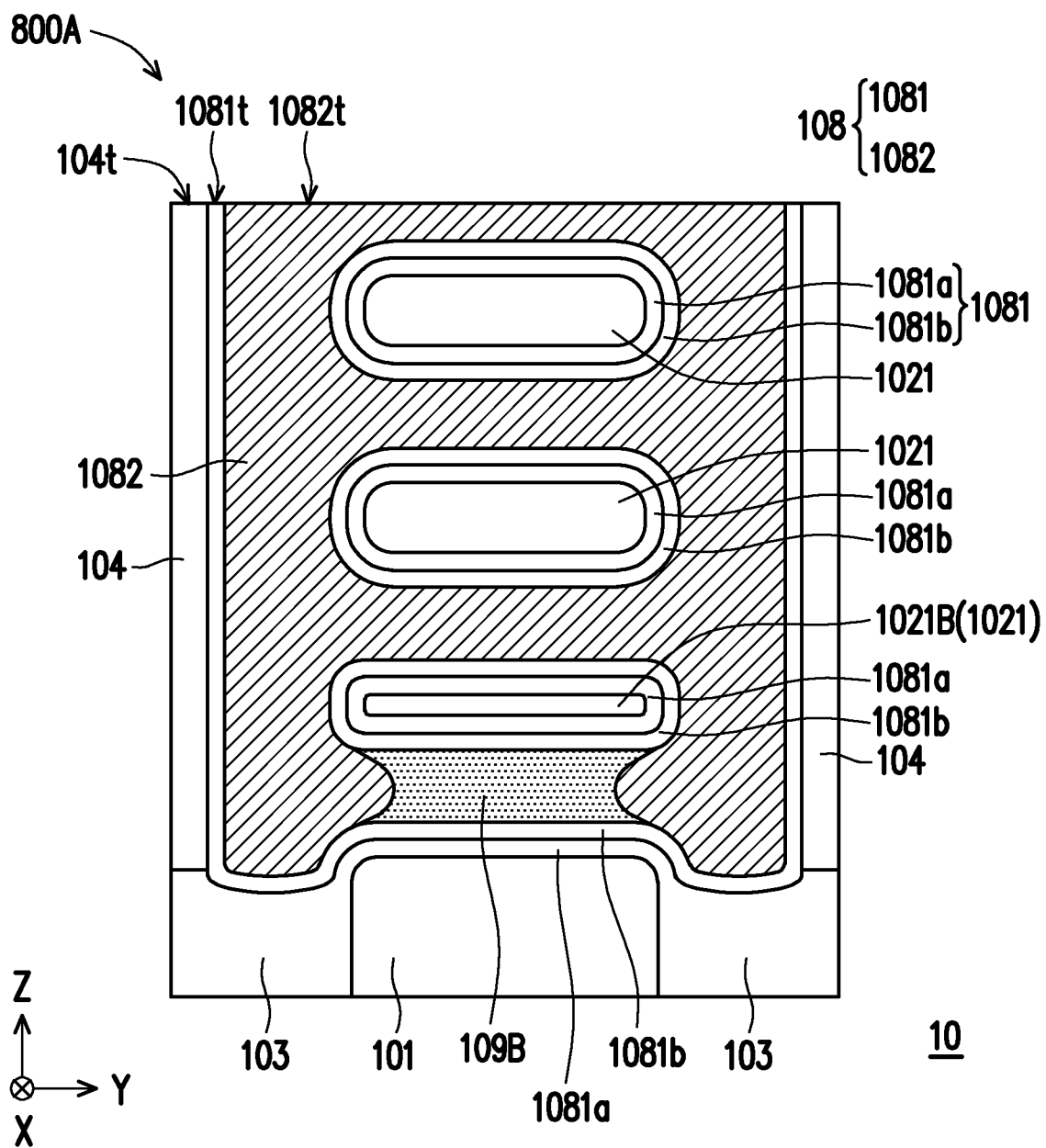
Figure 8B:
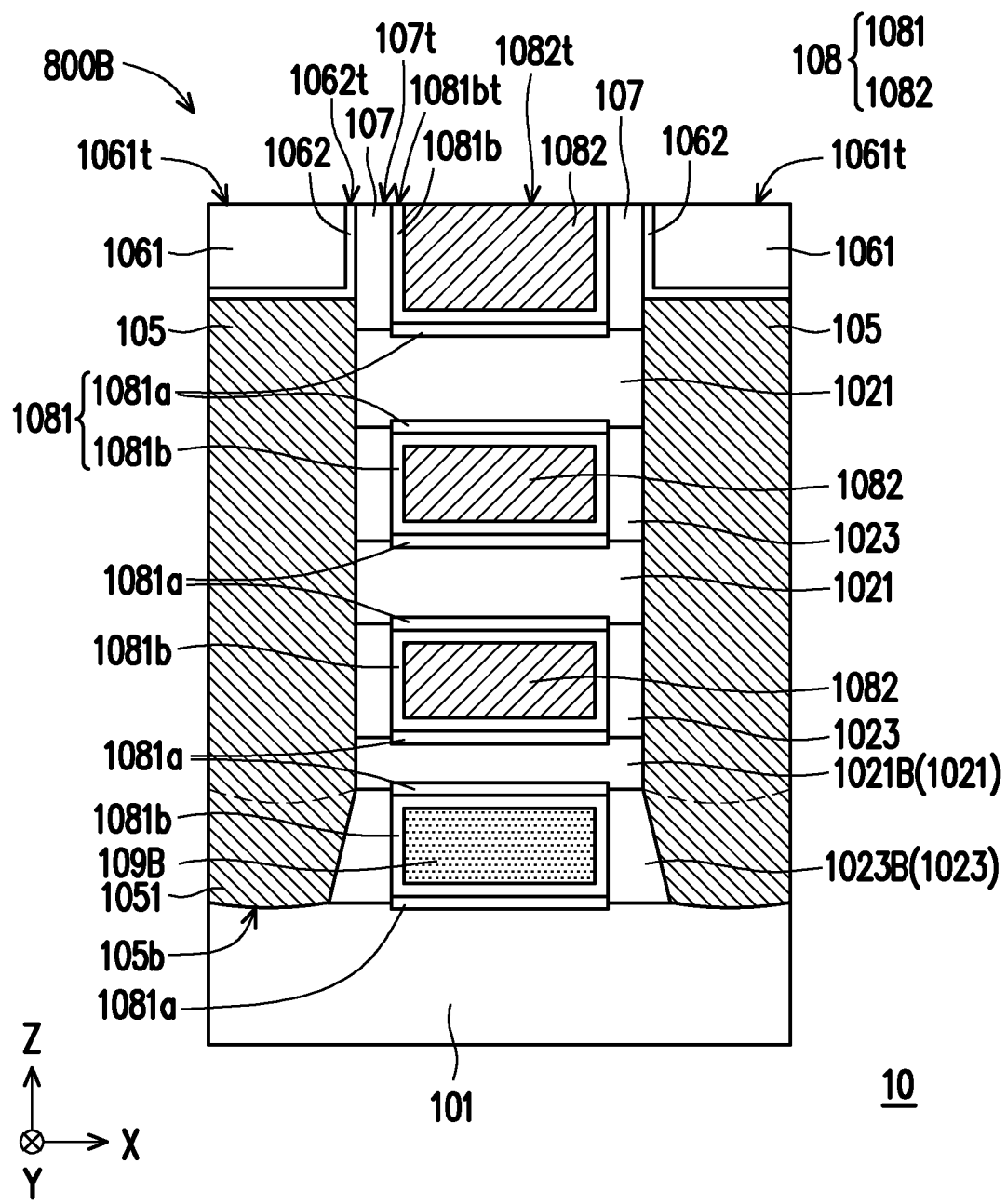

Referring to FIGS. 8A-8B and with reference to FIG. 7A-7B, in the Y-Z cross-section 800A and the X-Z cross-section 800B, a gate metal layer 1082 may be formed on the gate dielectric layer 1081 and may fill in the trenches 102T and the recesses 102R. In the Y-Z cross-section 800A, the gate metal layer 1082 may laterally cover the bottom dielectric spacer 109B and may be in direct contact with the sidewalls of the bottom dielectric spacer 109B. In the X-Z cross-section 800A, the gate metal layer 1082 fills the recesses 102R and may be wrapped around by the high-k dielectric layer 1081b, and also the gate metal layer 1082 fills the gate trench 107T. The gate metal layer 1082 may include a stack of multiple metal materials such as any number of liner layers, any number of work function layers, and a fill material. The gate metal layer 1082 in the p-type region may include p-type work function sublayer(s), while the gate metal layer 1082 in the n-type region may include n-type work function sublayer(s). Example p-type work function metal sublayer that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metal sublayer that may include Ti, Ag, TaAl, TaAlC, TiAlN, TaC, TaCN, TaSiN, Mn, Zr, other suitable n-type work function materials, or combinations thereof.

In some embodiments, a planarization process, (e.g., chemical mechanical polishing (CMP) process, an etching process, and/or other suitable processes) is performed to remove the excess portions of the gate dielectric layer 1081 and the material of the gate metal layer 1082 which are formed over the top surfaces 104t of the dielectric fin structures 104 in the Y-Z cross-section 800A and the top surfaces of the ILD layer 1061, the etch stop layer 1062, and the gate spacers 107 in the X-Z cross-section 800B. For example, in the Y-Z cross-section 800A, the top surface 1081t of the gate dielectric layer 1081 (e.g., the high-k dielectric layer 1081b) and the top surfaces 104t of the dielectric fin structures 104 are substantially leveled with the top surface 1082t of the gate metal layer 1082, within process variations. In the X-Z cross-section 800B, the top surface 1061t of the ILD layer 1061, the top surface 1062t of the etch stop layer 1062, and the top surface 107t of the gate spacers 107 are substantially leveled with the top surface 1082t of the gate metal layer 1082, within process variations. The remaining portions of the gate metal layer 1082 and the gate dielectric layer 1081 are collectively viewed as a gate structure 108 of a semiconductor device 10. The semiconductor device 10 may be referred to as a nanostructure field-effect transistor (nano-FET), where the semiconductor channel layers 1021 are semiconductor nanosheets.

It is commonly known that transistors are key components of modern integrated circuits. To satisfy the requirements of higher performance and lower power consumption, the gate lengths of transistors are constantly being scaled down. Scaling down the gate lengths leads to undesirable effects known as "short-channel effect (SCE)," with which the control of current flow by the gates is compromised. In addition, the short-channel effect induces a leakage concern. To reduce the short-channel effects and further increase the control of the channels, transistors having gate-all-around (GAA) structures (also called "GAA transistors" are developed. In a GAA transistor, the gate dielectric layer and the gate metal layer fully encircle the channel layer. The semiconductor device 10 is the GAA transistor. This configuration of the GAA transistor may deliver a good control of the channel and the short-channel effects may be reduced.

In addition, the semiconductor device 10 has the dielectric spacer 109B formed in the lowest recess (or gap) between the bottom semiconductor channel layer 1021B and the semiconductor substrate 101. By configuring the dielectric spacer 109B, the gate metal layer 1082 cannot be formed in the lowest recess between the bottom semiconductor channel layer 1021B and the semiconductor substrate 101, thereby eliminating parasitic capacitance. Moreover, the bottom semiconductor channel layer 1021B formed over the dielectric spacer 109B is designed to be the thinnest channel layer. In this manner, currant leakage from the S/D epitaxial structures or the thinnest semiconductor nanosheet (i.e. the channel region of the bottommost semiconductor channel layer 1021B) into the semiconductor substrate may be reduced.

FIGS. 9A, 10A, 11A, 12A, and 13A are schematic cross-sectional views illustrating various stages of a manufacturing method of a semiconductor device along the Y-direction, and FIGS. 9B, 10B, 11B, 12B, and 13B are schematic cross-sectional views illustrating various stages of a manufacturing method of a semiconductor device along the X-direction and corresponding to FIGS. 9A, 10A, 11A, 12A, and 13A, respectively, in accordance with some embodiments. Throughout the various views and illustrative embodiments of the present invention, like reference numbers are used to designate like elements.

Figure 9A:
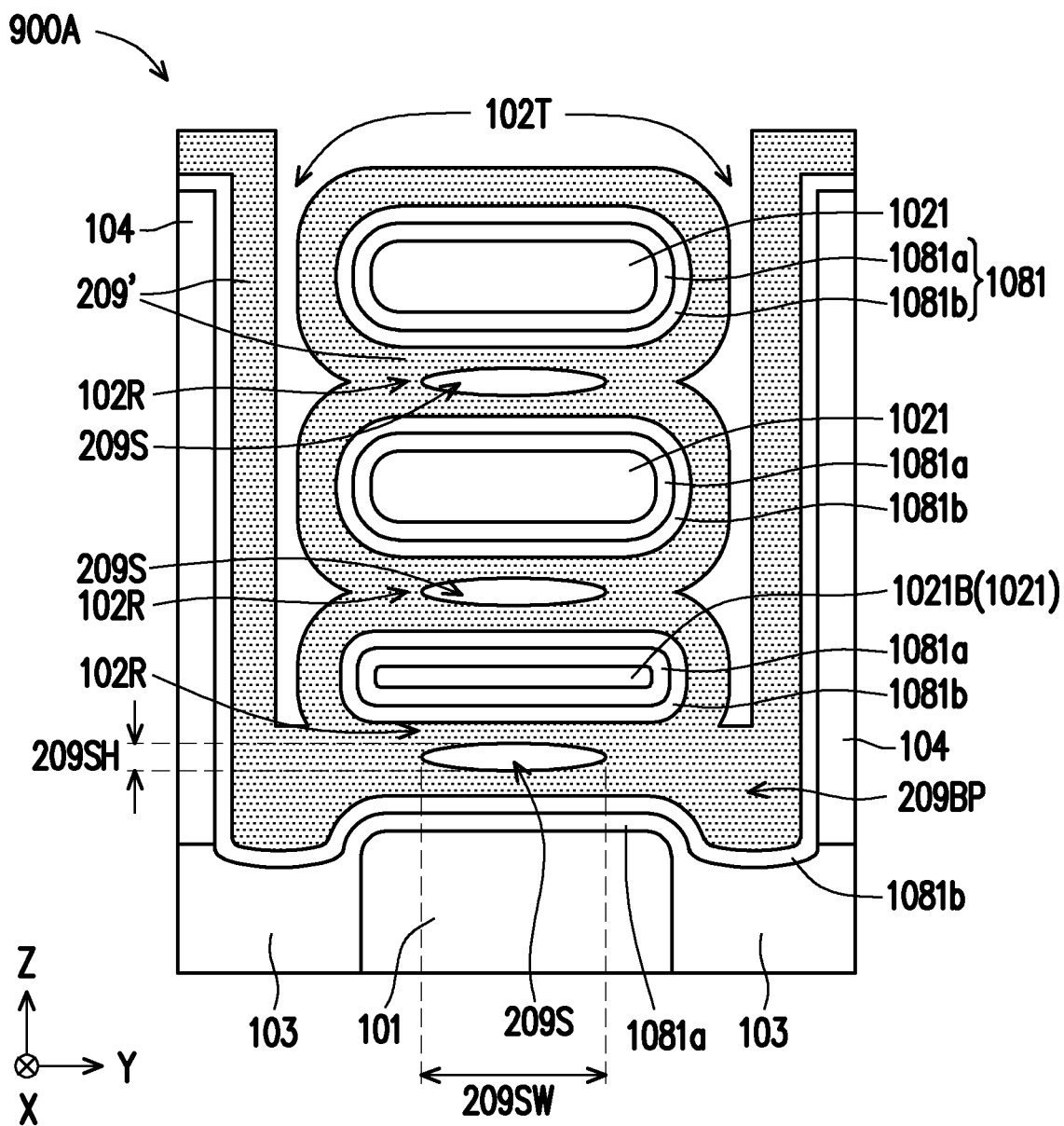
FIGS. 9A, 10A, 11A, 12A, and 13A are schematic cross-sectional views illustrating various stages of a manufacturing method of a semiconductor device along the Y-direction, in accordance with some embodiments.
Figure 9B:
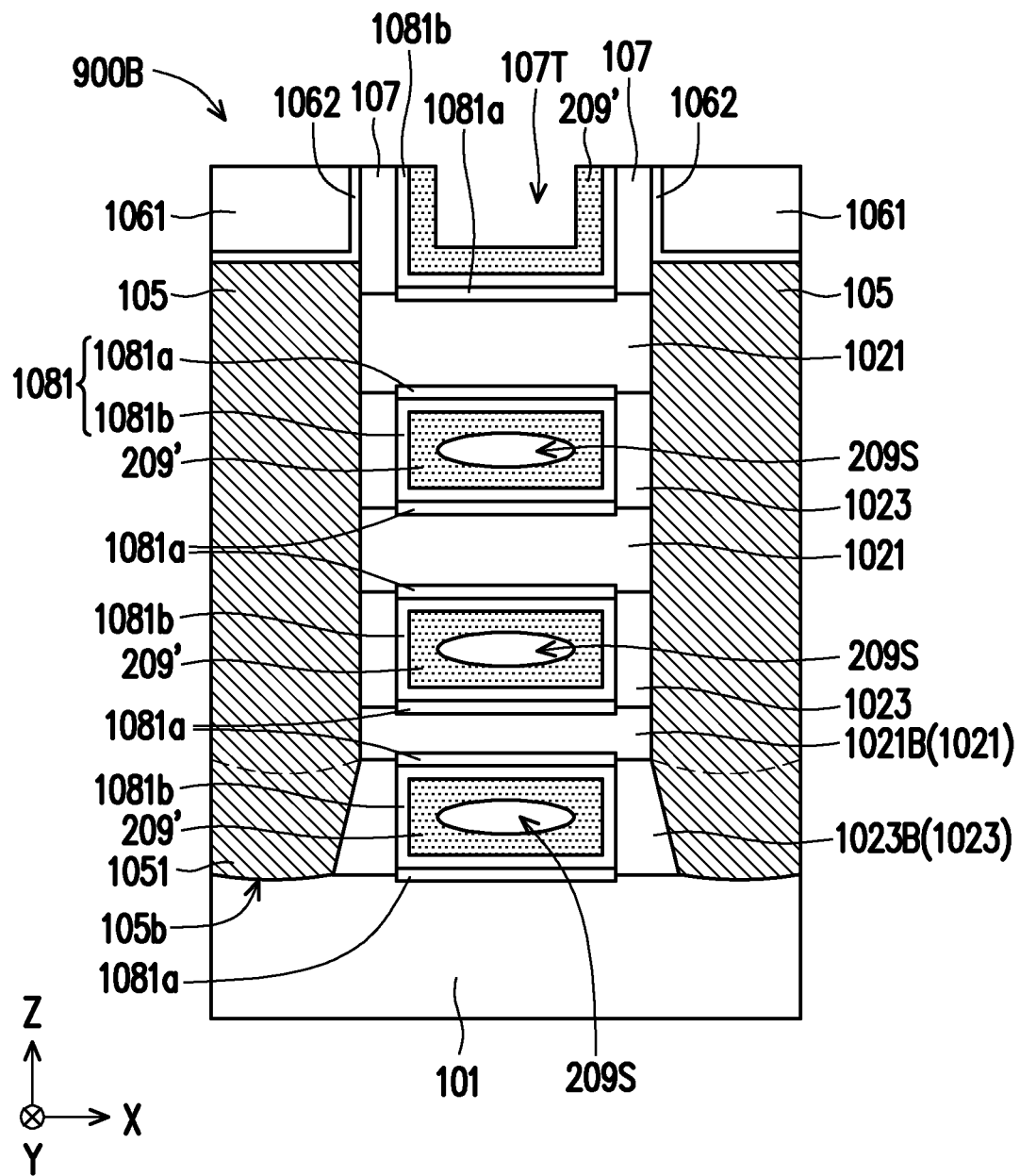
FIGS. 9B, 10B, 11B, 12B, and 13B are schematic cross-sectional views illustrating various stages of a manufacturing method of a semiconductor device along the X-direction and corresponding to FIGS. 9A, 10A, 11A, 12A, and 13A, respectively, in accordance with some embodiments.

Referring to FIGS. 9A-9B and with reference to FIGS. 4A-4B, in the Y-Z cross-section 900A and the X-Z cross-section 900B, the structures of FIGS. 9A-9B are similar to the structures shown in FIGS. 4A-4B, respectively, and thus the detailed descriptions are not repeated for the sake of brevity. The difference therebetween includes that the bottom portion 209BP of the dielectric spacer layer 209' overlying the gate dielectric layer 1081 on the isolation structures 103 is greater than the dielectric spacer layer 109' and seams (or voids) 209S may be produced in the dielectric spacer layer 209'. The material and the forming process of the dielectric spacer layer 209' may be similar to the dielectric spacer layer 109' described in FIGS. 4A-4B. In some embodiments, the seams 209S are left in the structure after the formation of the dielectric spacer layer 209'. The seams 209S may result from a conformal dielectric fill. In some embodiments, the seams 209S are embedded in and enclosed by the dielectric spacer layer 209' and more likely to be generated in the recesses 102R. The seams 209S may be defined by an area within the dielectric spacer layer 209' where an air gap may be formed. The term "air gap" is used to describe a void containing air, nitrogen, ambient gases, gaseous chemicals used in previous or current processes, or combinations thereof.

In some embodiments, the top/bottom ends of the seams 209S are vertically spaced apart from the gate dielectric layer 1081 by a non-zero distance. This may be achieved by adjusting the process conditions in the formation of the dielectric spacer layer 209' such as the deposition rate, the flow rates of the process gases, and the like. The maximum vertical dimension 209SH of each seam 209S measured between the top end and the bottom end in the Y-Z cross-section 900A may be less than 8 nm, such as about 0 nm to about 8 nm. The seams 209S in the dielectric spacer layer 209' may have substantially elliptical shapes. For example, the maximum vertical dimension 209SH of the respective seam 209S is measured in a minor axis extending substantially along the Z-direction. The maximum lateral dimension 209SW of each seam 209S measured in a major axis extends substantially along the Y-direction and may be less than that of the semiconductor channel layers 1021. However, the size and the shape of the seams 209S as illustrated herein is merely a non-limiting example and other sizes and shapes are possible. The various sizes and shapes of the seams 209S may be controlled by varying the process parameters.

Figure 10A:
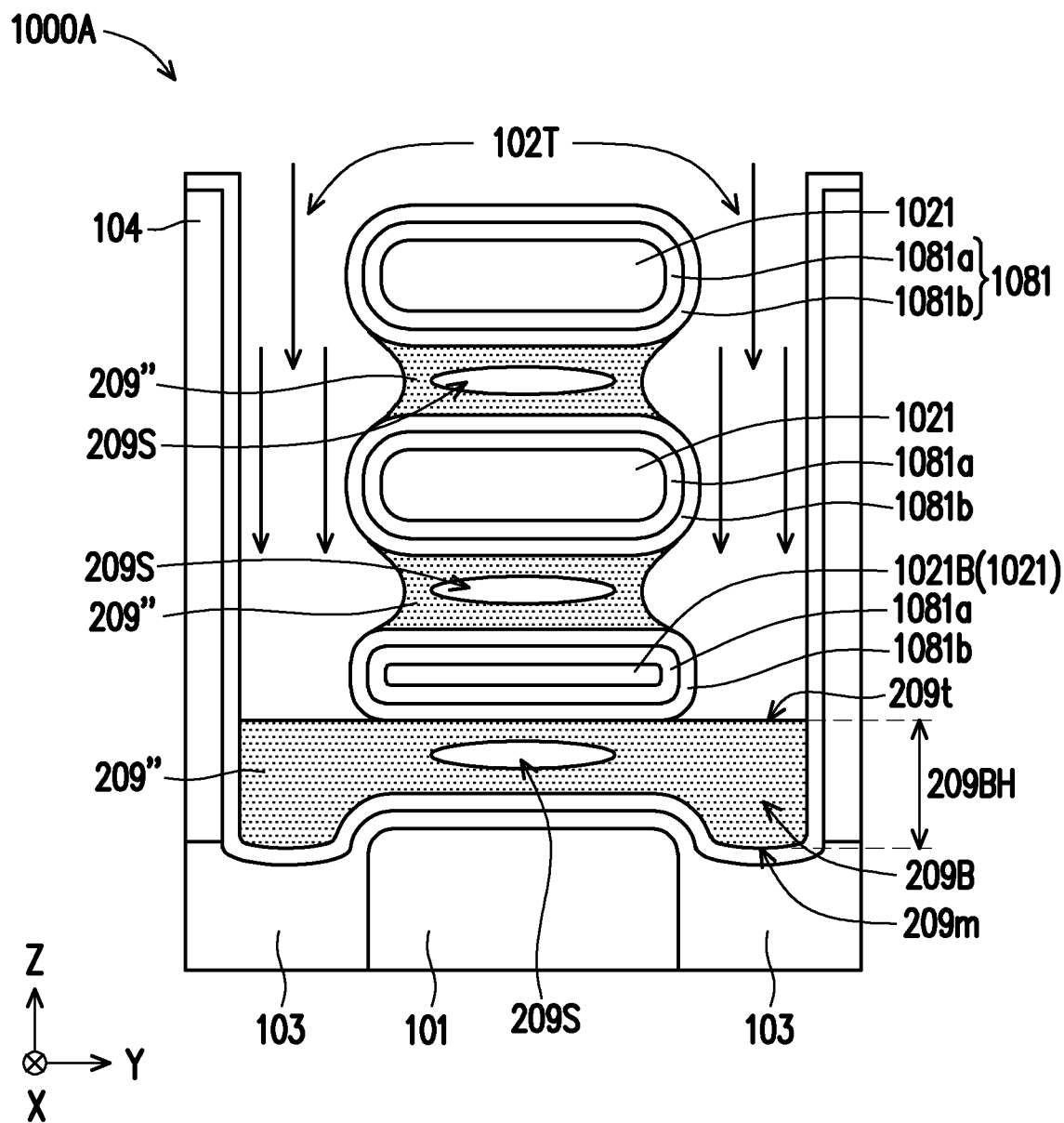
Figure 10B:
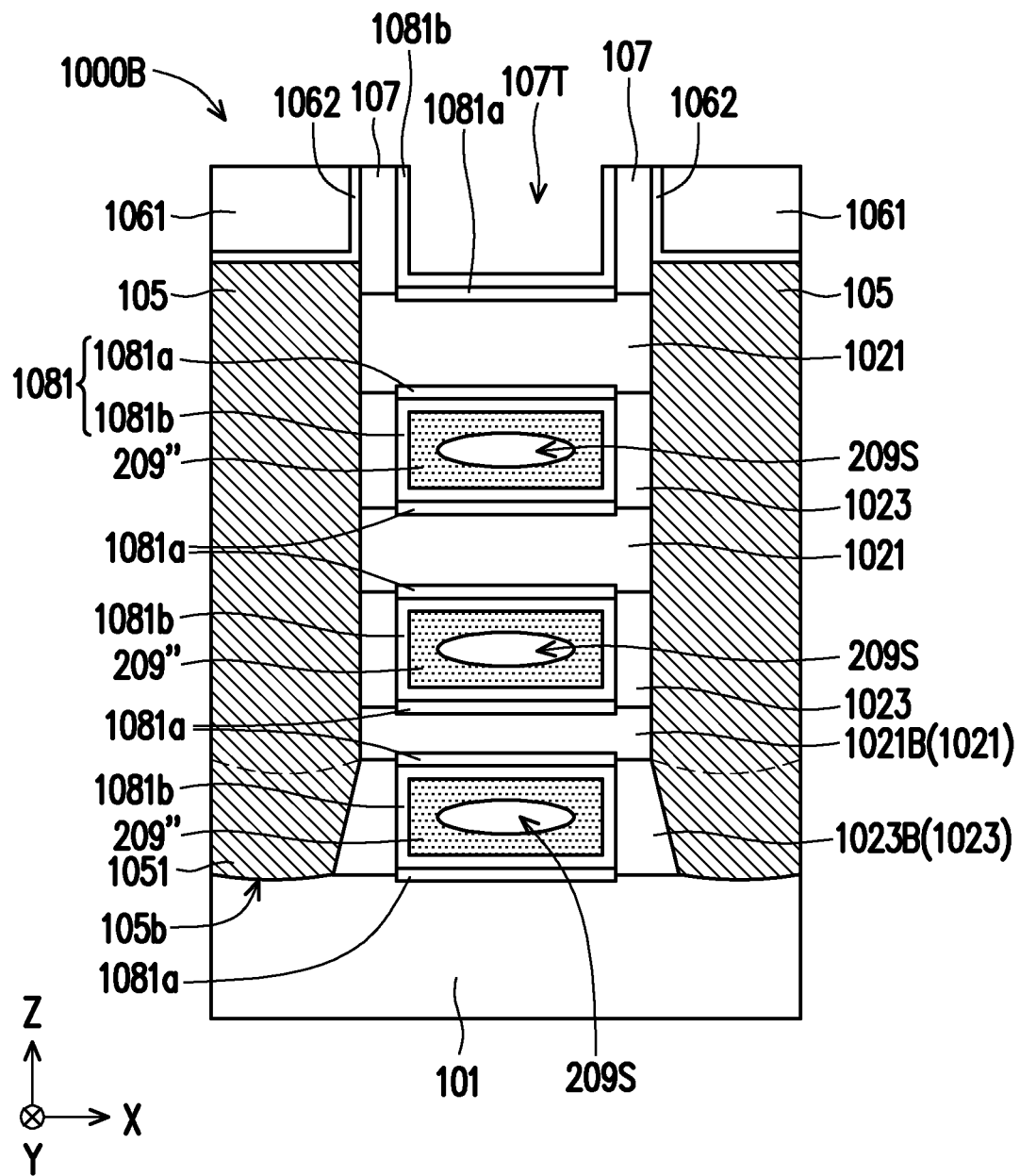

Referring to FIGS. 10A-10B and with reference to FIGS. 5A-5B, in the Y-Z cross-section 1000A and the X-Z cross-section 1000B, a portion of the dielectric spacer layer 209' may be removed to form dielectric spacers 209". For example, a dry etch is performed to etch the portion of the dielectric spacer layer 209' in a vertical direction as indicated by the arrows shown in FIG. 10A. The removal process of this stage may be similar to the process described in FIGS. 5A-5B, and thus the detailed descriptions are not repeated for the sake of brevity. In some embodiments, after the etching (e.g., anisotropic etch), the bottom portion 209BP of the dielectric spacer 209" are left over the isolation structure 103. For example, the bottom dielectric spacer 209B is not only vertically interposed between the semiconductor substrate 101 and the bottommost semiconductor channel layer 1021B but also extends along the Y-axis to be right over the isolation structure 103. In some embodiments, the maximum vertical dimension 209BH of the bottom portion 209BP of the dielectric spacer 209" measured between the top surface 209t to the bottommost surface 209m ranges from about 1 nm to about 30 nm. The seams 209S may remain in the dielectric spacers 209". For example, the maximum vertical dimension 209BH is greater than the maximum vertical dimension 209SH (labeled in FIG. 9A) of the respective seam 209S.

Figure 11A:
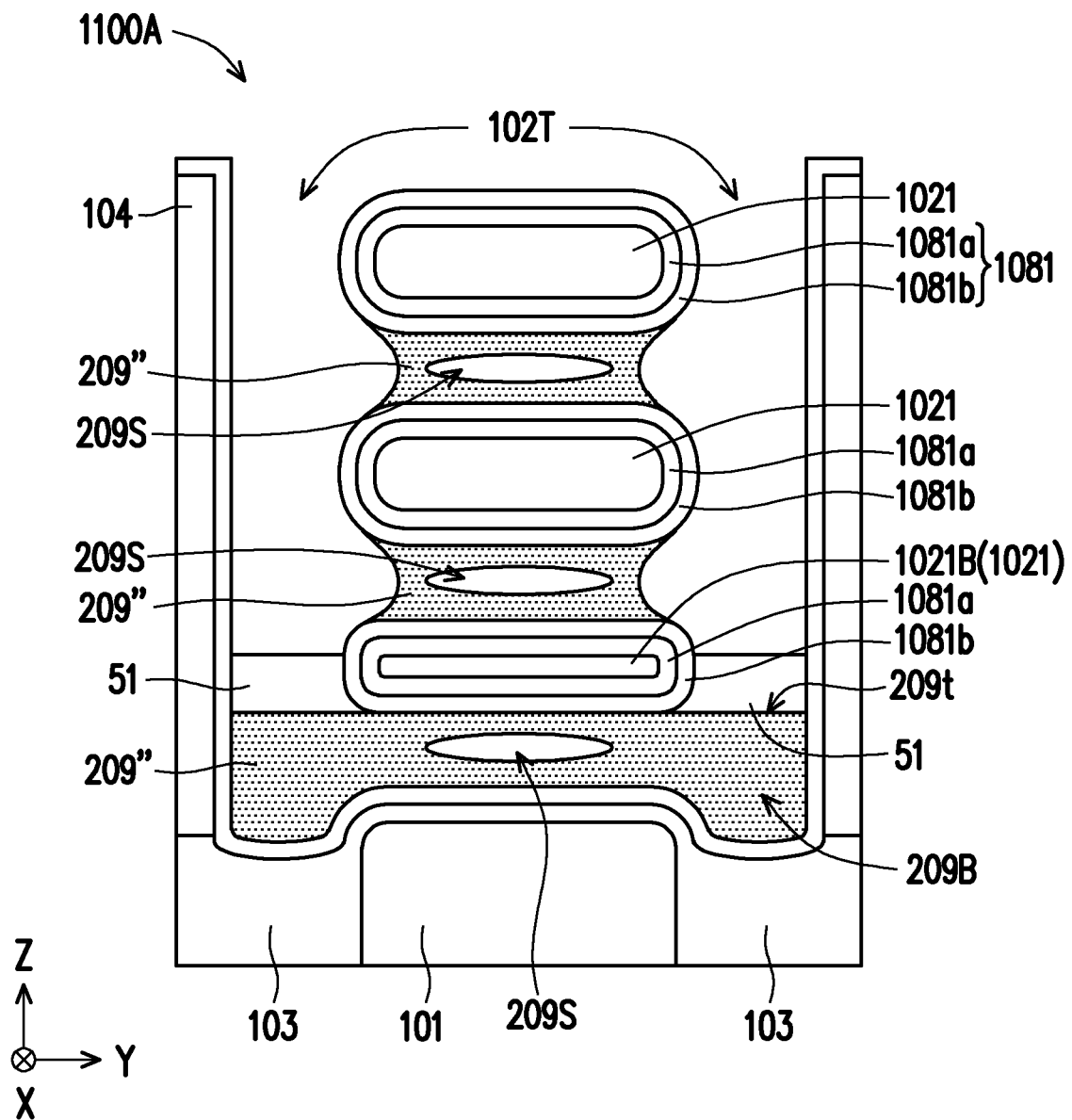
Figure 11B:
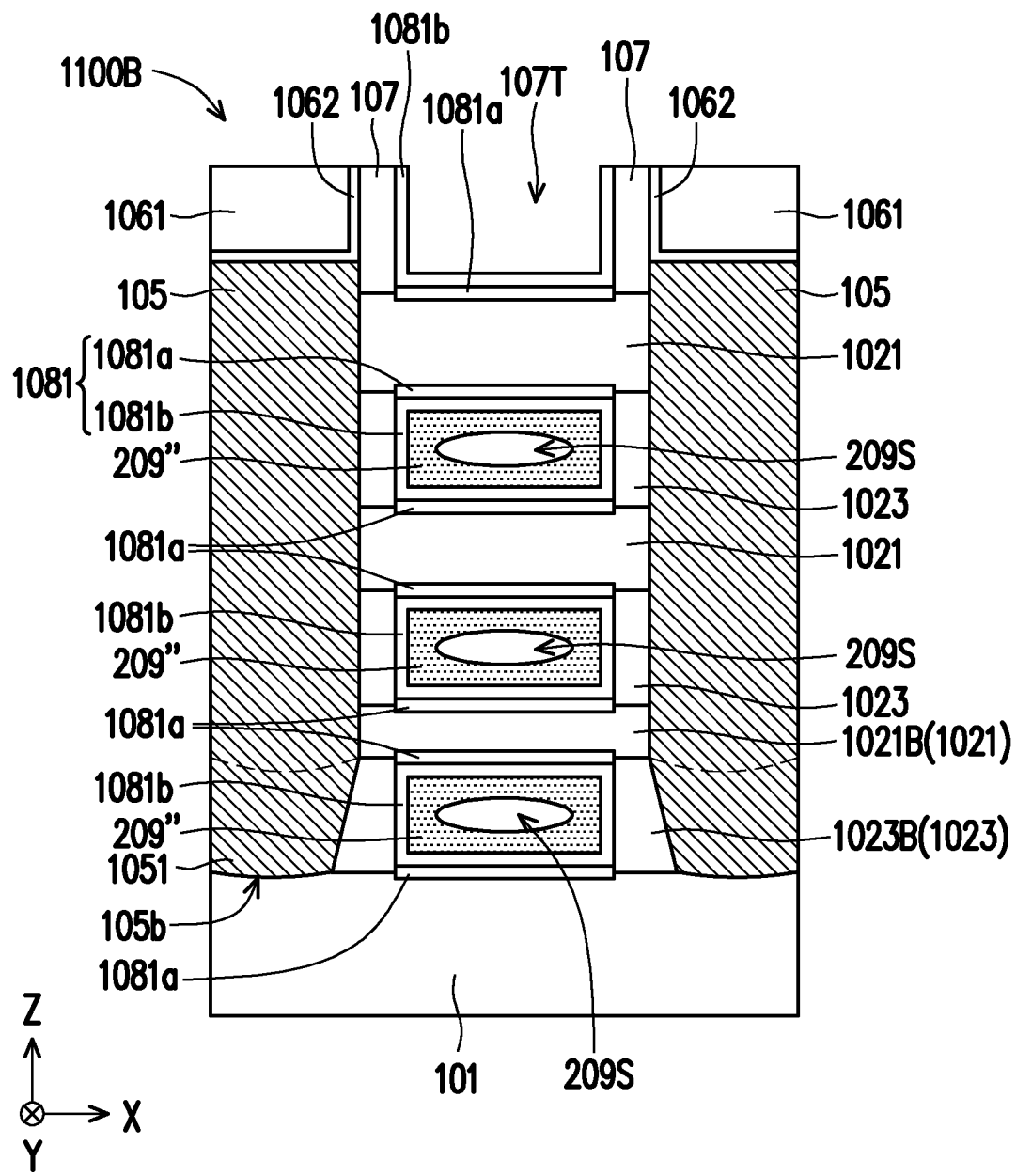

Referring to FIGS. 11A-11B and with reference to FIGS. 6A-6B, in the Y-Z cross-section 1100A and the X-Z cross-section 1100B, the BARC layer 51 may be formed on the top surface 209t of the bottom dielectric spacer 209B in the trenches 102T. The material and the forming process of the BARC layer 51 may be similar to the material and the forming process described in FIGS. 6A-6B, and thus the detailed descriptions are omitted for the sake of brevity. It should be understood that the formation of the BARC layer 51 cannot be observed in the X-Z cross-section 1100B.

Figure 12A:
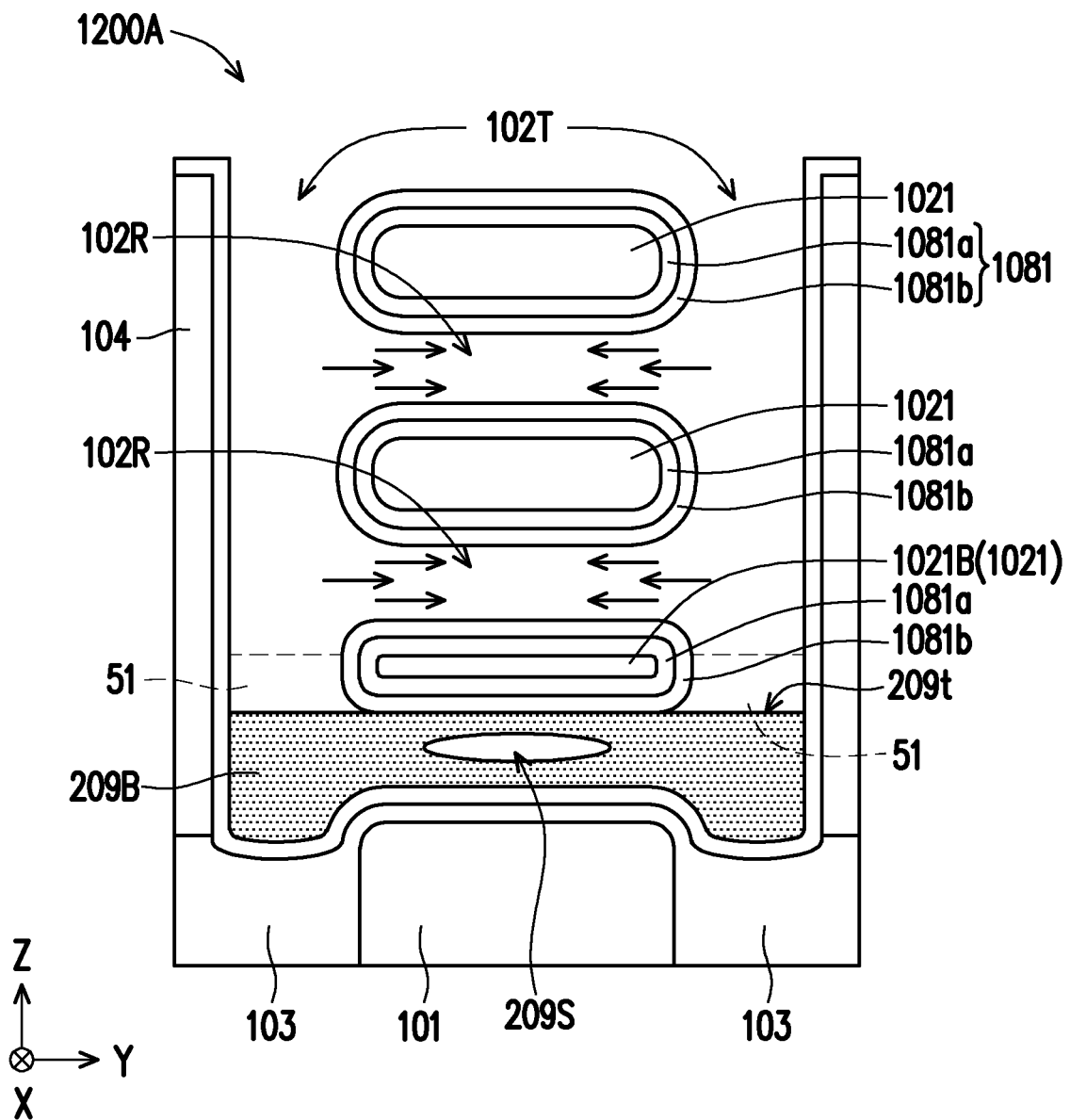
Figure 12B:
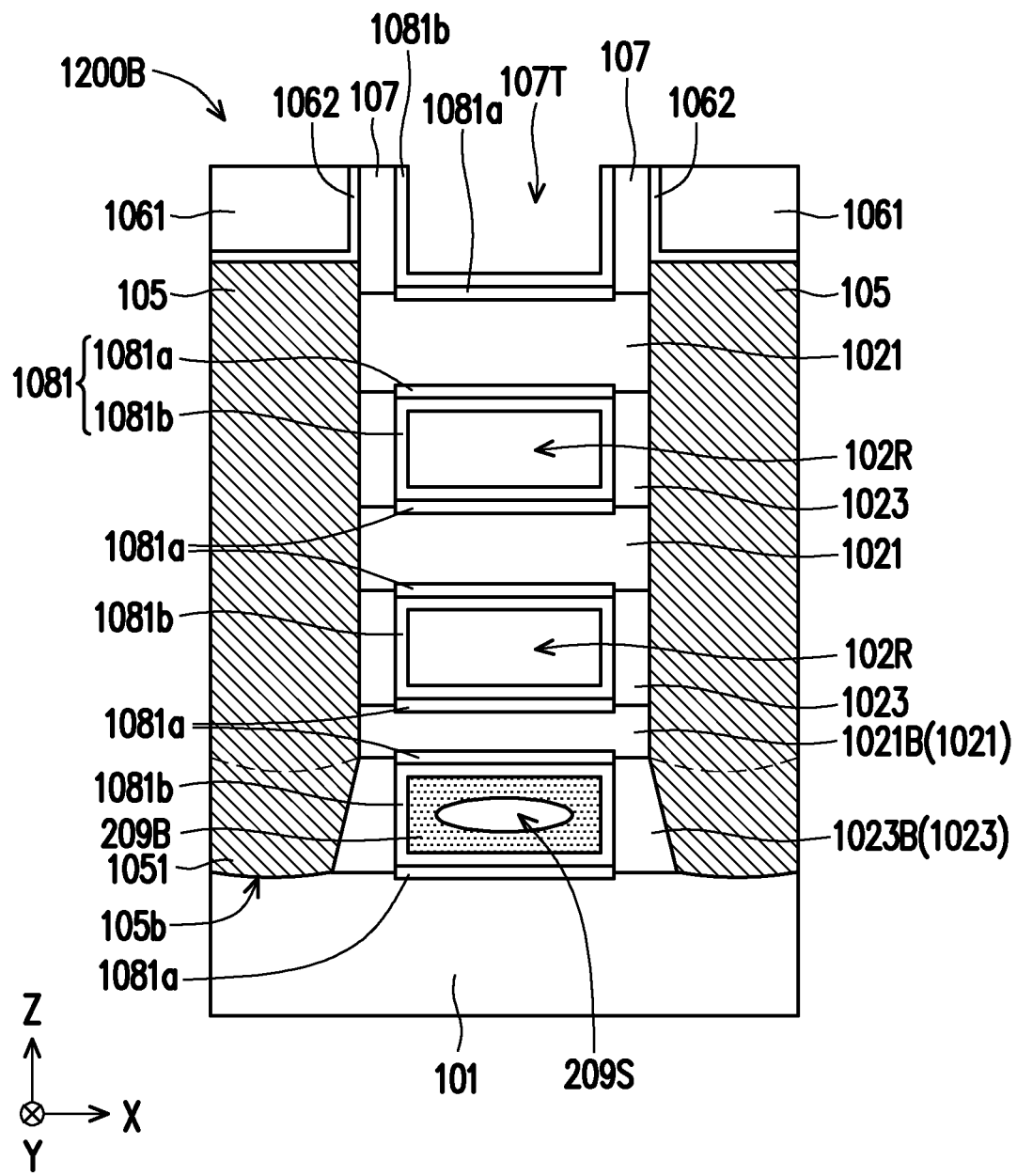

Referring to FIGS. 12A-12B and with reference to FIGS. 7A-7B, in the Y-Z cross-section 1200A and the X-Z cross-section 1200B, unmasked portions of the dielectric spacers 209" may be removed and only the bottom dielectric spacer 209B underlying the BARC 51 layer may remain. For example, a wet etch is performed to etch the dielectric spacers 209" over the BARC layer 51 in a horizontal direction as indicated by the arrows shown in FIG. 12A. The removal process of this stage may be similar to the process described in FIGS. 7A-7B, and thus the detailed descriptions are not repeated for the sake of brevity. Once the unmasked portions of the dielectric spacers 209" are removed to once again form the recesses 102R, the BARC layer 51 may be stripped to once again accessibly expose the top surface 209t of the bottom dielectric spacer 209B. The removal of the BARC layer 51 may be similar to the process described in FIGS. 7A-7B, and thus the detailed descriptions are not repeated for the sake of brevity.

Figure 13A:
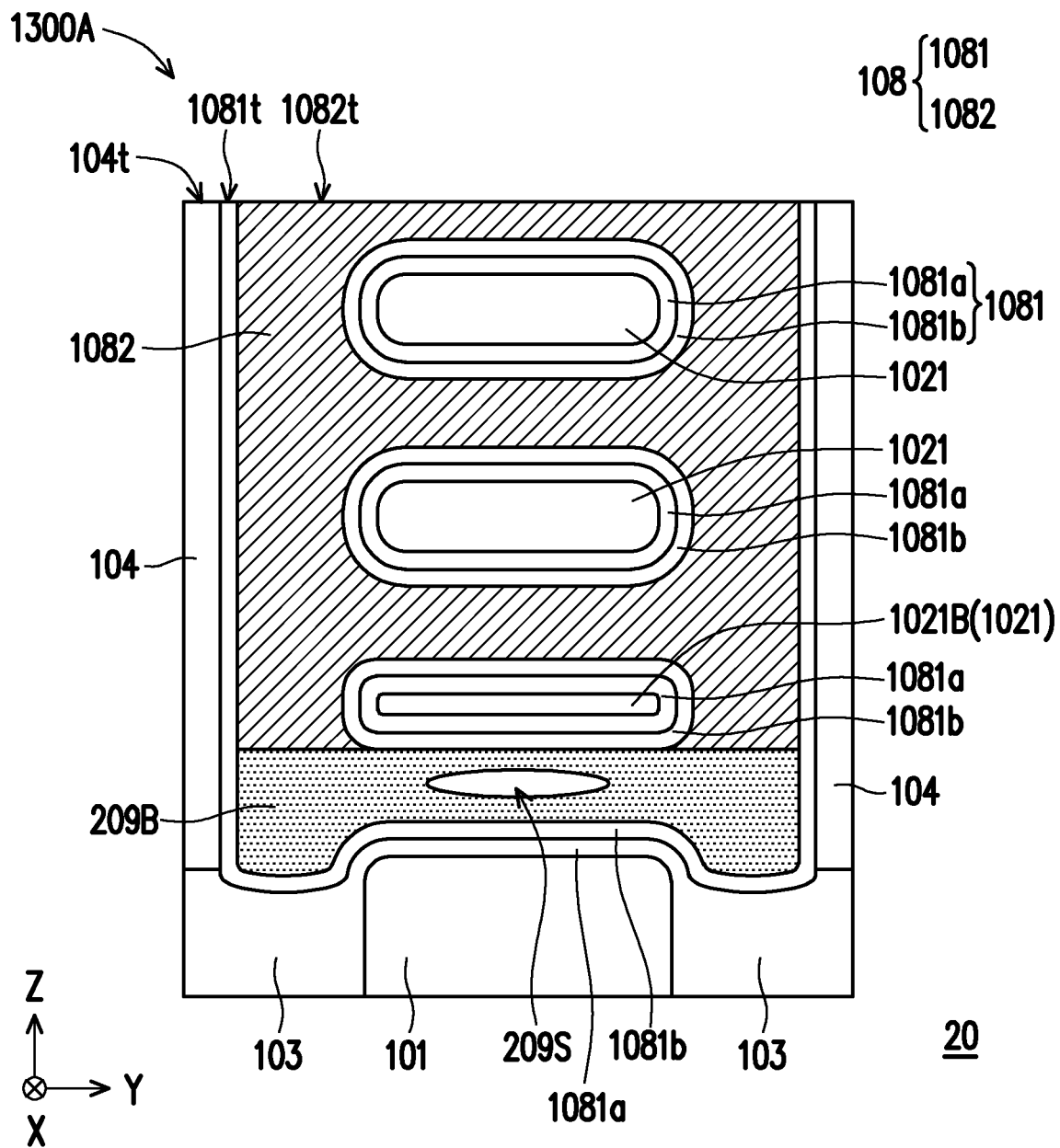
Figure 13B:
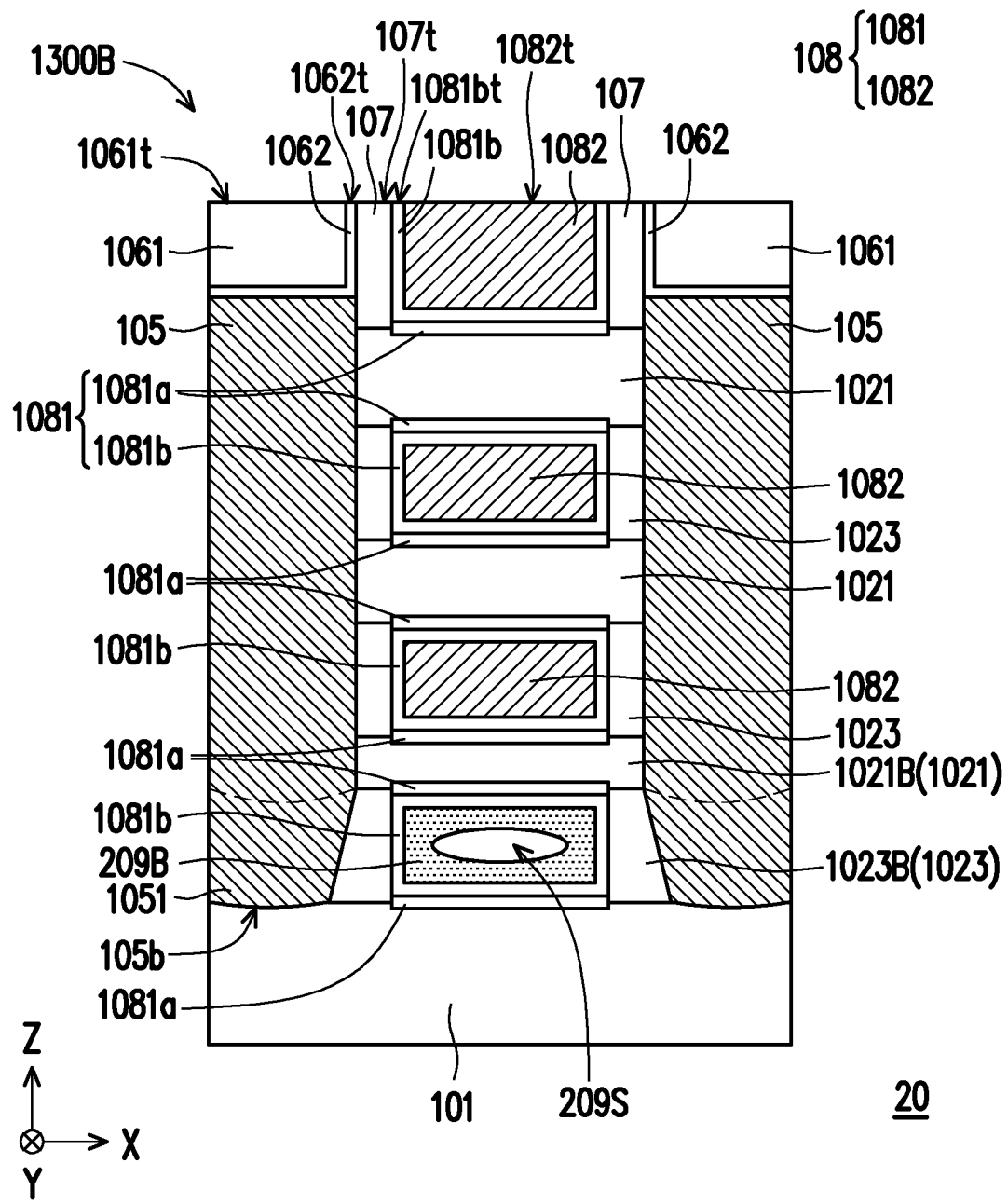

Referring to FIGS. 13A-13B and with reference to FIGS. 8A-8B, in the Y-Z cross-section 1300A and the X-Z cross-section 1300B, the gate metal layer 1082 may be formed on the gate dielectric layer 1081 and the top surface 209t of the bottom dielectric spacer 209B, and the gate metal layer 1082 may also fill in the trenches 102T and also in the recesses 102R. The material and the formation of the gate metal layer 1082 may be similar to the material and the forming process described in FIGS. 8A-8B, and thus the detailed descriptions are not repeated for the sake of brevity.

In some embodiments, a planarization process, (e.g., CMP process, an etching process, and/or other suitable processes) is performed to remove the excess portions of the gate dielectric layer 1081 and the material of the gate metal layer 1082 which are over the top surfaces 104t of the dielectric fin structures 104 in the Y-Z cross-section 1300A and the top surfaces of the ILD layer 1061, the etch stop layer 1062, and the gate spacers 107 in the X-Z cross-section 1300B. For example, in the Y-Z cross-section 1300A, the top surface 1081t of the gate dielectric layer 1081 (e.g., the high-k dielectric layer 1081b) and the top surfaces 104t of the dielectric fin structures 104 are substantially leveled with the top surface 1082t of the gate metal layer 1082, within process variations. In the X-Z cross-section 1300B, the top surface 1061t of the ILD layer 1061, the top surface 1062t of the etch stop layer 1062, and the top surface 107t of the gate spacers 107 are substantially leveled with the top surface 1082t of the gate metal layer 1082, within process variations. The remaining portions of the gate metal layer 1082 and the gate dielectric layer 1081 thus form the gate structure 108 of a semiconductor device 20 (e.g., a nanostructure FET).

The semiconductor device 20 having the thinnest bottom semiconductor channel layer 1021B formed over the bottom dielectric spacer 209B and the bottom dielectric spacer 209B completely separating the bottom semiconductor channel layer 1021B from the semiconductor substrate 101 may reduce capacitance and prevent leakage between the gate structure and the S/D structures. The seam 209S in the bottom dielectric spacer 209B may further reduce the parasitic capacitance in the semiconductor device 20. Because the dielectric nature of the seam 209S allows for a lower parasitic capacitance between the gate structure and the S/D epitaxial structures.

According to some embodiments, a semiconductor device includes semiconductor nanosheets, a gate structure, and a dielectric spacer. The semiconductor nanosheets are vertically stacked over each other, disposed above a semiconductor substrate, and serve as channel regions. A bottommost semiconductor nanosheet most proximate from the semiconductor substrate is a thinnest nanosheet of the semiconductor nanosheets. The gate structure surrounds each of the semiconductor nanosheets in a first cross-section, and the dielectric spacer is interposed between the bottommost semiconductor nanosheet and the semiconductor substrate and adjoins the gate structure in the first cross-section.

According to some alternative embodiments, a transistor includes semiconductor channel layers, a dielectric spacer, a gate structure, and source/drain (S/D) epitaxial structures. The semiconductor channel layers are disposed over a semiconductor substrate and vertically separate apart from one another, a first vertical spacing is between a bottommost semiconductor channel layer and the semiconductor substrate, a second vertical spacing is between adjacent two of the semiconductor channel layers over the bottommost semiconductor channel layer, and the bottommost semiconductor channel layer is the thinnest semiconductor channel layer among the semiconductor channel layers. The dielectric spacer is disposed in a first gap having the first vertical spacing. The gate structure covers the semiconductor channel layers and the dielectric spacer and is disposed in a second gap having the second vertical spacing in a first cross-section. The S/D epitaxial structures are disposed on the semiconductor substrate and laterally abutting the semiconductor channel layers in a second cross-section.

According to some alternative embodiments, a manufacturing method of a semiconductor device includes forming semiconductor nanosheets over a semiconductor substrate, wherein the semiconductor nanosheets are vertically stacked over each other and separates apart from each other, and a bottom semiconductor nanosheet is most proximate from the semiconductor substrate; forming a gate dielectric layer around each of the semiconductor nanosheets and on the semiconductor substrate; forming a bottom dielectric spacer in a gap between the bottom semiconductor nanosheet and the semiconductor substrate to adjoin the gate dielectric layer; and forming a gate metal layer on the gate dielectric layer and surrounding the bottom dielectric spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
semiconductor nanosheets vertically stacked over each other, disposed above a semiconductor substrate, and serving as channel regions, and a bottommost semiconductor nanosheet most proximate from the semiconductor substrate being a thinnest nanosheet of the semiconductor nanosheets;
a gate structure surrounding each of the semiconductor nanosheets in a first cross-section, the gate structure comprising a gate dielectric layer; and
a dielectric spacer interposed between the bottommost semiconductor nanosheet and the semiconductor substrate and adjoining the gate structure in the first cross-section, wherein the dielectric spacer is wrapped around by the gate dielectric layer.

2. The semiconductor device of claim 1, wherein a maximum spacing between the bottommost semiconductor nanosheet and the semiconductor substrate is less than or substantially equal to a maximum spacing between adjacent two of the semiconductor nanosheets disposed over the bottommost semiconductor nanosheet.

3. The semiconductor device of claim 2, wherein a thickness of the bottommost semiconductor nanosheet is less than the maximum spacing between the adjacent two of the semiconductor nanosheets.

4. The semiconductor device of claim 1, wherein the dielectric spacer is laterally covered by the gate structure in the first cross-section.

5. The semiconductor device of claim 1, further comprising:
source/drain (S/D) epitaxial structures disposed on the semiconductor substrate and laterally abutting the semiconductor nanosheets in a second cross-section; and
inner spacers interposed between the S/D epitaxial structures and the gate structure in the second cross-section.

6. The semiconductor device of claim 5, wherein in the second cross-section, bottommost inner spacers of the inner spacers are disposed at opposing sides of the dielectric spacer.

7. The semiconductor device of claim 6, wherein in the second cross-section, a high-k dielectric layer wraps around the dielectric spacer and separates the bottommost inner spacers of the inner spacers from the dielectric spacer.

8. The semiconductor device of claim 1, further comprising:
isolation structures disposed at opposing sides of the semiconductor substrate, and the dielectric spacer extends to be over the isolation structures.

9. The semiconductor device of claim 8, wherein a seam is in the dielectric spacer and between the bottommost semiconductor nanosheet and the semiconductor substrate.

10. The semiconductor device of claim 8, wherein in the first cross-section, the gate structure comprises:
a gate metal layer overlying the gate dielectric layer and being in direct contact with a top surface of the dielectric spacer over the isolation structures, wherein the gate dielectric layer is in direct contact with the top surface, a bottom surface and the sidewall of the dielectric spacer.

11. A transistor, comprising:
semiconductor channel layers disposed over a semiconductor substrate and vertically separating apart from one another, a first vertical spacing being between a bottommost semiconductor channel layer and the semiconductor substrate, a second vertical spacing being between adjacent two of the semiconductor channel layers over the bottommost semiconductor channel layer, and the bottommost semiconductor channel layer being the thinnest semiconductor channel layer among the semiconductor channel layers;
a dielectric spacer disposed in a first gap having the first vertical spacing, wherein in the first cross-section, a sidewall of the dielectric spacer is recessed relative to a sidewall of the bottommost semiconductor channel layer;
a gate structure covering the semiconductor channel layers and the dielectric spacer and disposed in a second gap having the second vertical spacing in a first cross-section; and
source/drain (S/D) epitaxial structures disposed on the semiconductor substrate and laterally abutting the semiconductor channel layers in a second cross-section.

12. The transistor of claim 11, wherein in the first cross-section, a thickness of the bottommost semiconductor channel layer is less than a thickness of the semiconductor channel layers disposed over the bottommost semiconductor channel layer.

13. The transistor of claim 11, wherein in the first cross-section, the dielectric spacer is laterally covered by the gate structure.

14. The transistor of claim 11, wherein in the second cross-section, the dielectric spacer is wrapped around by a gate dielectric layer of the gate structure.

15. The transistor of claim 11, wherein in the first cross-section, a lateral dimension of the dielectric spacer is greater than a lateral dimension of each of the semiconductor channel layers.

16. The transistor of claim 15, wherein a seam is disposed in the dielectric spacer and between the bottommost semiconductor channel layer and the semiconductor substrate.

17. A semiconductor device, comprising:
a semiconductor substrate;
a first channel layer disposed over the semiconductor substrate;
a dielectric spacer vertically between the semiconductor substrate and the first channel layer, the dielectric spacer comprises a bottom surface, a sidewall connected to the bottom surface, and a top surface opposite to the bottom surface and connected to the sidewall;
a second channel layer disposed over the first channel layer, a thickness of the first channel layer being less than that of the second channel layer; and
a gate structure disposed on the dielectric spacer to cover the first channel layer, the gate structure wrapping around the second channel layer, the gate structure comprising a high-k dielectric layer, and the high-k dielectric layer covers the bottom surface, the sidewall, and a portion of the top surface of the dielectric spacer.

18. The semiconductor device of claim 17, wherein a seam is in the dielectric spacer.

19. The semiconductor device of claim 17, further comprising:
source/drain (S/D) epitaxial structures disposed on the semiconductor substrate and laterally abutting the first channel layer and the second channel layer.

20. The semiconductor device of claim 17, wherein the gate structure further comprises a gate metal layer overlying the high-k dielectric layer, and another portion of the top surface of the dielectric spacer is covered by the gate metal layer.

* * * * *